US009318586B2

(12) United States Patent
Lee

(10) Patent No.: US 9,318,586 B2
(45) Date of Patent: Apr. 19, 2016

(54) HIGH VOLTAGE SEMICONDUCTOR DEVICE AND METHOD FOR FABRICATING THE SAME

(71) Applicant: Samsung Electronics Co., Ltd., Suwon-si, Gyeonggi-do (KR)

(72) Inventor: Nam Young Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 69 days.

(21) Appl. No.: 13/974,558

(22) Filed: Aug. 23, 2013

(65) Prior Publication Data

US 2014/0084332 A1    Mar. 27, 2014

(30) Foreign Application Priority Data

Sep. 21, 2012    (KR) .................. 10-2012-0105253

(51) Int. Cl.
| | | |
|---|---|---|
| H01L 29/739 | (2006.01) | |
| H01L 27/082 | (2006.01) | |
| H01L 27/102 | (2006.01) | |
| H01L 29/06 | (2006.01) | |
| H01L 29/66 | (2006.01) | |
| H01L 29/423 | (2006.01) | |
| H01L 29/08 | (2006.01) | |

(52) U.S. Cl.
CPC ........ *H01L 29/7393* (2013.01); *H01L 27/0823* (2013.01); *H01L 27/1022* (2013.01); *H01L 29/0619* (2013.01); *H01L 29/0696* (2013.01); *H01L 29/66348* (2013.01); *H01L 29/7397* (2013.01); *H01L 29/0834* (2013.01); *H01L 29/4238* (2013.01)

(58) Field of Classification Search
CPC ..................... H01L 27/0823; H01L 27/1022
See application file for complete search history.

(56) References Cited

U.S. PATENT DOCUMENTS

| | | |
|---|---|---|
| 2001/0054738 A1 | 12/2001 | Momota et al. |
| 2006/0289928 A1 | 12/2006 | Takaya et al. |
| 2007/0114598 A1 | 5/2007 | Hotta et al. |
| 2008/0087951 A1 | 4/2008 | Takaya et al. |
| 2008/0173876 A1 | 7/2008 | Ueno |
| 2010/0039844 A1 | 2/2010 | Arai et al. |

(Continued)

FOREIGN PATENT DOCUMENTS

| | | |
|---|---|---|
| JP | 2006093459 A | 4/2006 |
| JP | 2008205252 A | 9/2008 |

(Continued)

*Primary Examiner* — Stephen W Smoot
(74) *Attorney, Agent, or Firm* — Harness, Dickey & Pierce, P.L.C.

(57) ABSTRACT

According to example embodiments of inventive concepts: a semiconductor device includes: first and second trench gates extending long in one direction in a substrate; third and fourth trench gates in the substrate, the third and fourth trench gates connecting the first and second trench gates with each other; a first region defined in the substrate by the first to fourth trench gates and surrounded by the first to fourth trench gates; and a second region and a third region defined in the substrate. The second region is in surface contact with the first region. The third region is in point contact with the first region. The first region includes a first high-voltage semiconductor device including a body of a first conduction type and an emitter of a second conduction type in the body. Floating wells of the first conduction type are in the second region and the third region.

31 Claims, 25 Drawing Sheets

(56) References Cited

U.S. PATENT DOCUMENTS

2012/0043581 A1    2/2012  Koyama et al.
2012/0292662 A1*  11/2012  Matsuura et al. ............. 257/139

FOREIGN PATENT DOCUMENTS

| KR | 2009-0024596 A | 3/2009 |
| KR | 20110015788 A  | 2/2011 |

\* cited by examiner

HIGH VOLTAGE SEMICONDUCTOR DEVICE AND METHOD FOR FABRICATING THE SAME

CROSS-REFERENCE TO RELATED APPLICATIONS

This application claims priority under 35 U.S.C. §119 to Korean Patent Application No. 10-2012-0105253, filed on Sep. 21, 2012 in the Korean Intellectual Property Office, the disclosure of which is incorporated herein in its entirety by reference.

BACKGROUND

1. Field

Example embodiments of inventive concepts relate to a semiconductor device and/or a method for fabricating the same, and more particularly to an insulated gate bipolar mode transistor and/or a method for fabricating the same.

2. Description of the Related Art

Examples of high-voltage semiconductor devices include an insulated gate bipolar mode transistor (hereinafter referred to as an "IGBT"), a power MOSFET, and a bipolar transistor.

In particular, the IGBT is a switching device having a structure in which a power MOSFET and a bipolar transistor are mixed. The IGBT may have a low driving power, a high switching speed, a high withstanding voltage, and/or a high current density. The IGBT may include an emitter formed on one surface of a substrate and a collector formed on the other surface of the substrate. Due to this structure, a channel of the IGBT may be formed in a vertical direction.

SUMMARY

Example embodiments of inventive concepts relate to a semiconductor device that can improve conduction modulation.

Example embodiments of inventive concepts also relate to a method for fabricating a semiconductor device that can improve conduction modulation.

Additional advantages, subjects, and/or features of inventive concept will be set forth in part in the description that follows and in part will become apparent to those having ordinary skill in the art upon from the following more particular description of non-limiting embodiments of inventive concepts or may be learned from the practice of example embodiments of inventive concepts.

According to example embodiments of inventive concepts, a semiconductor device includes: a substrate; first and second trench gates extending long in one direction in the substrate; third and fourth trench gates in the substrate, the third and fourth trench gate connecting the first and second trench gates with each other; a first region defined in the substrate by the first to fourth trench gates, the first region being surrounded by the first to fourth trench gates, the first region including a first high-voltage semiconductor device, the first high-voltage semiconductor device including a body and an emitter in the body, the body being a first conduction type, and the emitter being a second conduction type that is opposite the first conduction type; and a second region and a third region defined in the substrate, the second region being in surface contact with the first region, the third region being in point contact with the first region, the second region and the third region including floating wells that are the first conduction type.

In example embodiments, a vertical thickness of the body may be less than a vertical thickness of the first trench gate, and a vertical thickness of the floating wells may be more than the vertical thickness of the body.

In example embodiments, the vertical thickness of the floating wells may be thicker than the vertical thickness of the first trench gate.

In example embodiments, a length of the second region in the one direction may be longer than a length of the first region in the one direction.

In example embodiments, the semiconductor device may further include fifth and sixth trench gates in the substrate, and a second high-voltage semiconductor device may be in the substrate between the fifth and sixth trench gates. The fifth and sixth trench gates may extend long in the long direction.

In example embodiments, a length between the first trench gate and the second trench gate may be shorter than a length between the second trench gate and the fifth trench gate.

In example embodiments, the third region and a part of the second region may be between the second trench gate and the fifth trench gate, and the third region and the part of the second region may be connected with each other.

In example embodiments, a third high-voltage semiconductor device may be in the substrate between the first and second trench gates, and a portion of the second region may be between the first high-voltage semiconductor device and the third high-voltage semiconductor device.

In example embodiments, the third and fourth trench gates may cross the first and second trench gates.

In example embodiments, the emitter may be in two portions of the first region.

In example embodiments, the emitter may be in only a part of the two portions of the first region, and the two portions of the first region may be at opposite sides of the first region.

According to example embodiments of inventive concepts, a semiconductor device includes: a substrate; a first trench gate structure in the substrate, the first trench gate structure having a ladder shape; first and second regions defined in the substrate, the first and second region surrounded by portions of the first trench gate structure, the first region including a high-voltage semiconductor device, the high-voltage semiconductor device including a body having a first conduction type and vertical thickness that is less than a vertical thickness of the first trench gate, the high-voltage semiconductor device including an emitter in the body, the emitter having a second conduction type that is opposite the first conduction type, and the second regions including a first floating well having the first conduction type and a vertical thickness that is thicker than the vertical thickness of the first trench gate.

In example embodiments, the first region may be one among a plurality of first regions defined in the substrate, the second region may be one among a plurality of second regions defined in the substrate, the plurality of first regions and the plurality of second regions may be alternately arranged, and the high-voltage semiconductor devices in the plurality of first regions and the first floating wells of the plurality of second regions may be alternately repeated with each other.

In example embodiments, a length direction of the first trench gate may extend in one direction, and a length of the second region in the one direction may be longer than a length of the first region in the one direction.

In example embodiments, the semiconductor device may include a second trench gate structure in the substrate, wherein the second trench gate structure may have the ladder shape, and the second trench gate structure may be adjacent to the first trench gate structure.

In example embodiments, the semiconductor device may include a third region defined in the substrate between the first trench gate structure and the second trench gate structure, wherein the third region may include a second floating well having the first conduction type.

In example embodiments, the emitter may be in two portions of the first region.

In example embodiments, the emitter may be formed in only a part of the two portions of the first region, and the two portions of the first region may be at opposite sides of the first region.

According to example embodiments of inventive concepts, a semiconductor device includes: a substrate; a first repetition unit in the substrate, and a second repetition unit in the substrate. The first repetition unit includes first and second trench gates extending long in one direction. The first repetition unit includes third and fourth trench gates connecting the first and second trench gates with each other. The first repetition unit includes a first region defined by the first to fourth trench gates and surrounded by the first to fourth trench gates. The first region includes a plurality of first high-voltage semiconductor devices. The first repetition unit includes a second region defined in the substrate. The second region is in surface contact with the first region. The second region includes a plurality of first floating wells having the first conduction type. The second repetition unit includes a plurality of second high voltage semiconductor devices and a plurality of second floating wells. The second floating wells have the first conduction type. The first repetition unit and the second repetition unit are different from each other.

In example embodiments, a width ration of one of the plurality of first high-voltage semiconductor devices to one of the plurality of first floating wells in the first repetition unit may be different than a width ratio of one of the plurality of second high-voltage semiconductor devices to one of the plurality of second floating wells in the second repetition unit.

In example embodiments, a length of the second region in the one direction may be longer than a length of the first region in the one direction.

In example embodiments, the first repetition unit may further include a third region defined in the substrate. The third region may be in point contact with the first region. The third region may include some of the plurality of first floating wells.

According to example embodiments of inventive concepts, a method for fabricating a semiconductor device includes: forming first and second trench gates and third and fourth trench gates in a substrate. The first and second trench gates extend long in one direction. The third and fourth trench gates connect the first and second trench gates with each other. The first to fourth trench gates define a first region of the substrate that is surrounded by the first to fourth trench gates. The first region of the substrate is in surface contact with a second region defined in the substrate. The first region is in point contact with a third region defined in the substrate. The method further includes forming floating wells of a first conduction type in the first region; and forming a high-voltage semiconductor device in the first region. The high-voltage semiconductor device includes a body of the first conduction type body and an emitter of a second conduction type in the body.

In example embodiments, the method may include forming a doping of a first conduction type in the substrate before the forming of the first and second trench gates and the third and fourth trench gates, wherein the forming floating wells may include diffusing the first conduction type doping region in the second region and the third region.

According to example embodiments of inventive concepts, a semiconductor device includes: a substrate and a first trench gate structure. The substrate includes a first region and a second region. The first region includes a transistor that is defined by a body of a first conduction type in the substrate, an emitter of a second conduction type in the body, and a doping region of the first conduction type in a portion of the body that is exposed by the emitter. The second region includes a floating well of the first conduction type. The floating well has a vertical thickness that is greater than a vertical thickness of the body in the first direction. The first trench gate structure is between the second region and a perimeter of the first region. The first trench exposes the first region and the second region of the substrate. The first trench gate structure has a vertical thickness that is greater than the vertical thickness of the body in the first region.

In example embodiments, a collector may contact a lower surface of the substrate, and an emitter electrode may be electrically connected to the doping region of the transistor in the first region of the substrate.

In example embodiments, the region of the substrate may be one among a plurality of first regions in the substrate, the second region of the substrate may be one among a plurality of second regions in the substrate, some of the plurality of the second may alternate along a first direction with the plurality of first regions between alternating run of the first trench gate structure having the ladder shape, and others of the plurality of second region may be arranged as pairs separated by the trench gate structure and one of the plurality of first regions along a direction. The second direction may cross the first direction.

In example embodiments, a length in the first direction of one of the plurality of first regions may be less than a length in the first direction of one of the some of the plurality of second regions.

In example embodiments, a width in the second direction of one of the plurality of the first regions may be less than a width in the second direction of one of the others of the plurality of second regions.

BRIEF DESCRIPTION OF THE DRAWINGS

The above and other features and advantages of example embodiments of inventive concepts will be more apparent from the following more particular description of non-limiting embodiments of inventive concepts, taken in conjunction with the accompanying drawings, in which:

FIG. 18A is a cross-sectional view cut along line XVIII-XVIII' of FIG. 18B.

DETAILED DESCRIPTION OF EXAMPLE EMBODIMENTS

Figure 1:
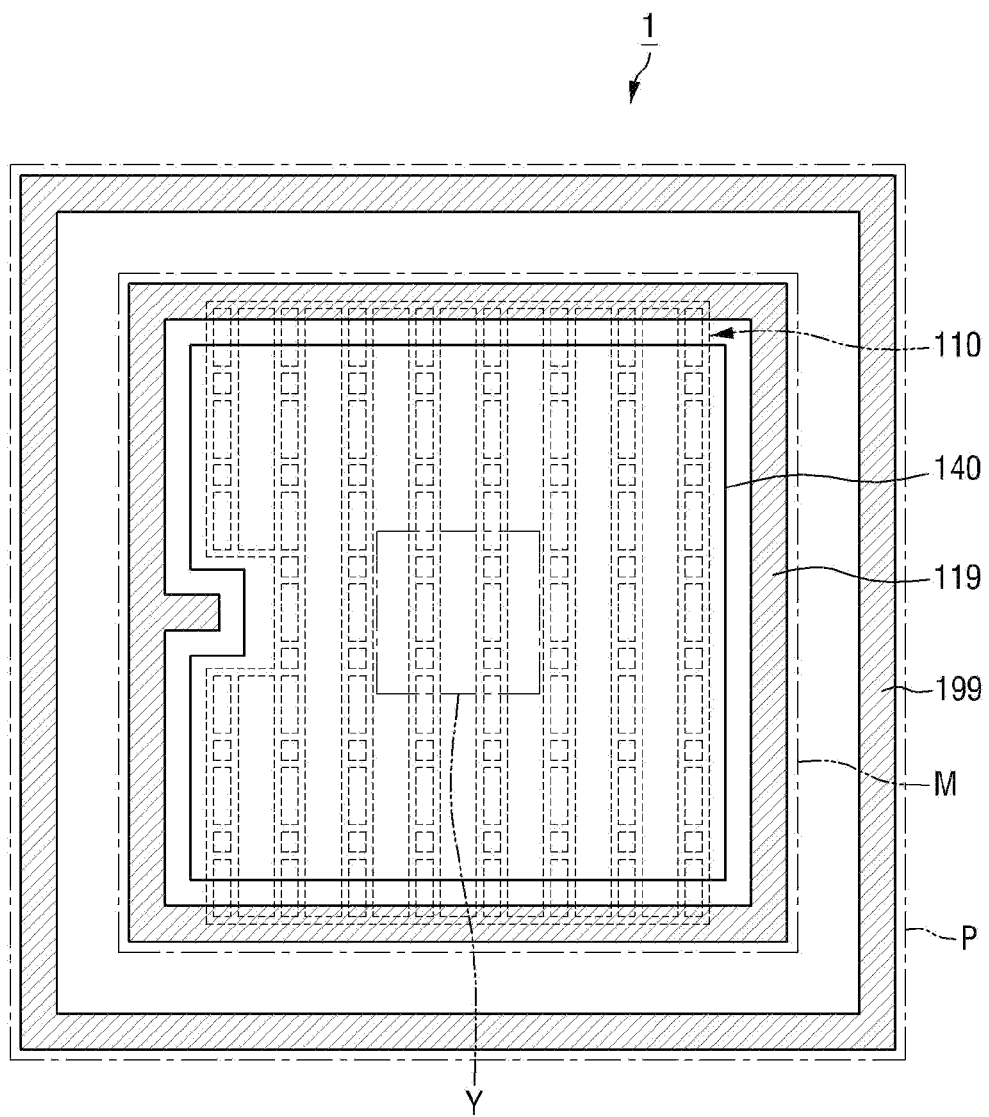
FIG. 1 is a plan view explaining a semiconductor device according to example embodiments of inventive concepts.

Example embodiments of inventive concepts will now be described more fully with reference to the accompanying drawings, in which some example embodiments are shown. Example embodiments of inventive concepts, may, however, be embodied in many different forms and should not be construed as being limited to the embodiments set forth herein; rather, these embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

In some descriptions of example embodiments of inventive concepts, well-known methods, procedures, components, and/or circuitry are not described in detail in order to avoid unnecessarily obscuring aspects of example embodiments of inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of inventive concepts.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
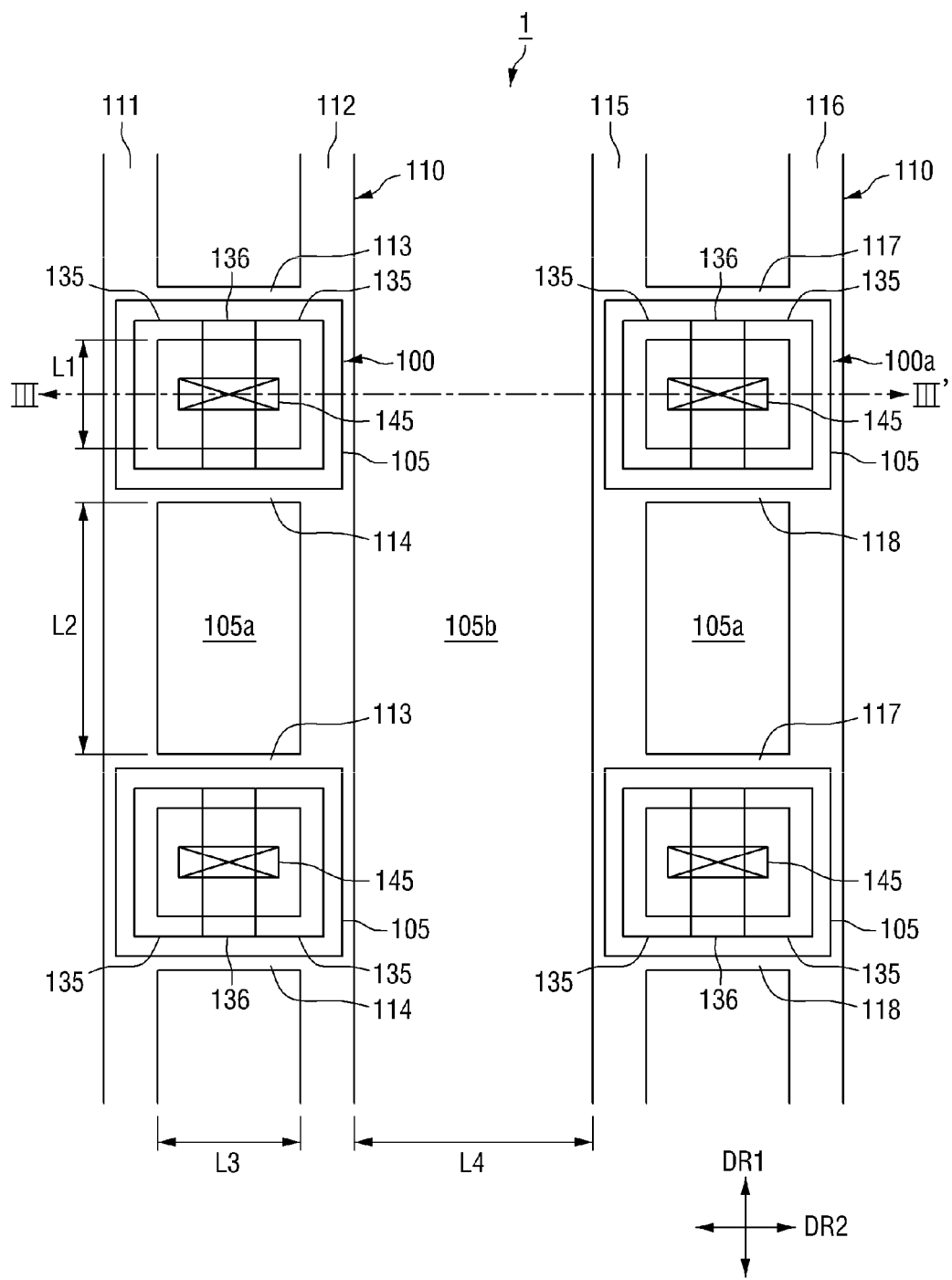
FIG. 2 is a partial layout diagram of the semiconductor device according to example embodiments of inventive concepts.
Figure 3:
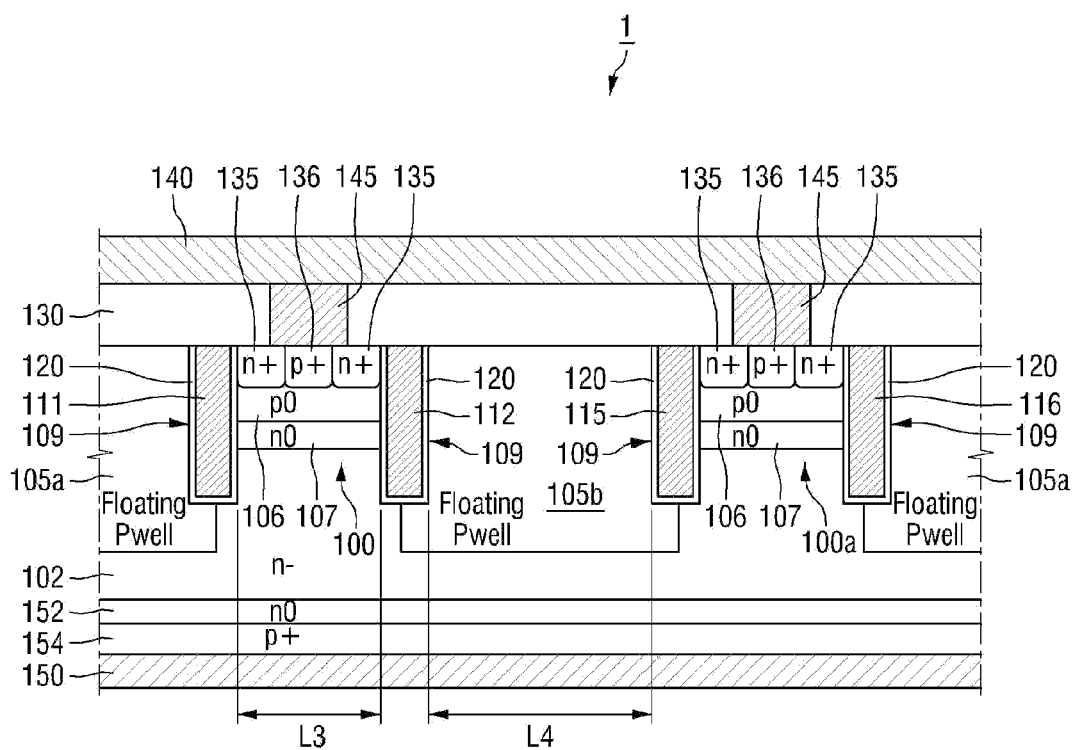
FIG. 3 is a cross-sectional view taken along line III-III' in FIG. 2.
Figure 4:
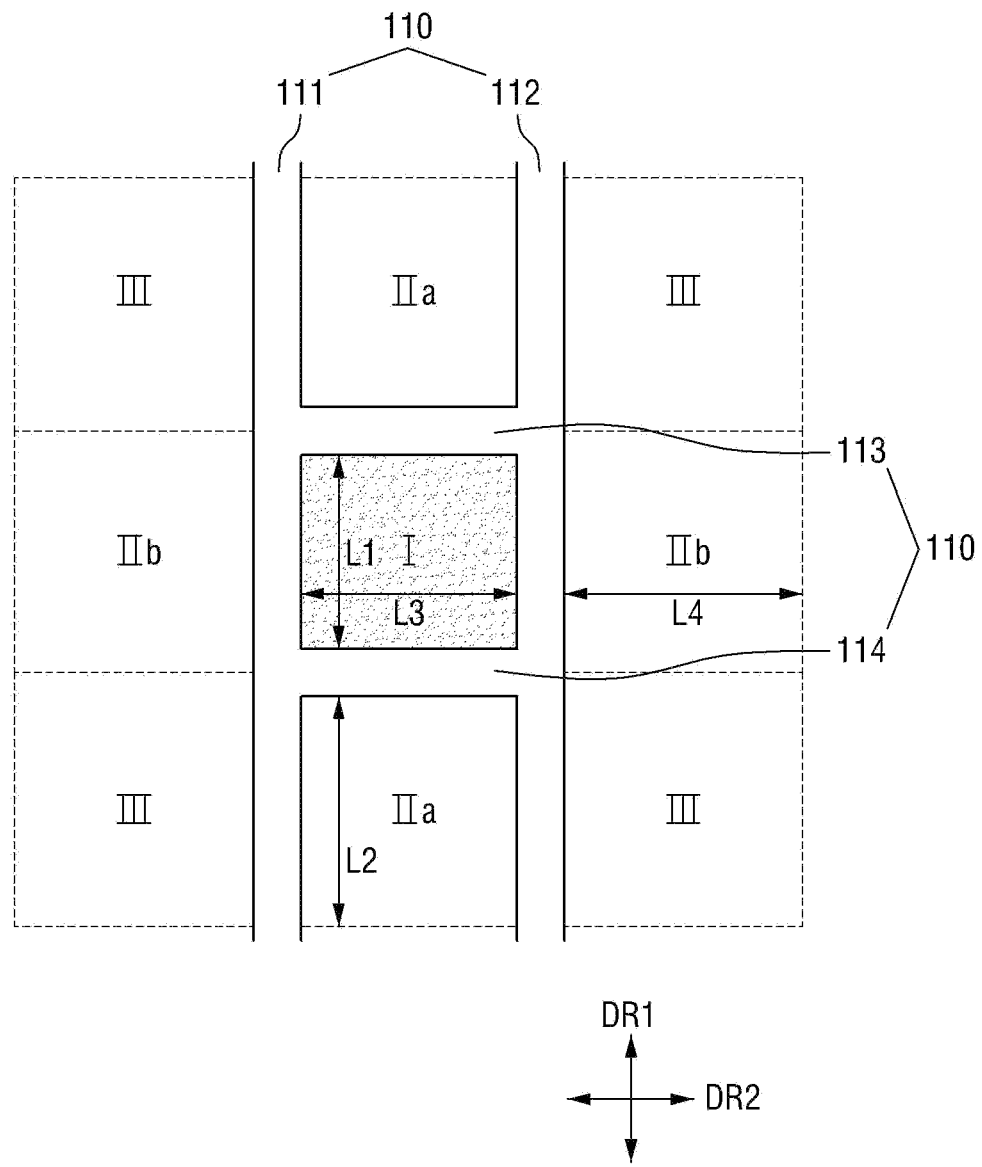
FIG. 4 is a view explaining the structure of a trench gate in FIG. 2.

FIG. 1 is a plan view explaining a semiconductor device according to example embodiments of inventive concepts. FIG. 2 is a partial layout diagram of the semiconductor device according to example embodiments of inventive concepts. FIG. 2 is a partial enlarged layout diagram illustrating in detail a region Y in FIG. 1. FIG. 3 is a cross-sectional view taken along line III-III' in FIG. 2. FIG. 4 is a view explaining the structure of a trench gate in FIG. 2.

First, referring to FIG. 1, a semiconductor device 1 according to example embodiments of inventive concepts may include a device forming region M and a termination region P. The device forming region M is a region in which a high-voltage semiconductor device 100 to be described later and floating wells (see 105a and 105b of FIG. 3) are formed, and the termination region P is a region in which a termination ring for field diffusion and a field plate 199 are formed. An emitter electrode 140 is connected to an emitter (see 135 in FIG. 3) of the high-voltage semiconductor device 100, and may be in a plate shape. As illustrated, a trench gate structure 110 may be in a ladder shape. A wiring 119 is connected to the trench gate structure 110. The wiring 119 may be shaped to surround the emitter electrode 140 in order to apply the same voltage to the trench gate structure 110.

Referring to FIGS. 2 and 3, the semiconductor device 1 according to example embodiments of inventive concepts may include the high-voltage semiconductor device 100 and the floating wells 105a and 105b.

The high-voltage semiconductor device 100 may be an IGBT, but is not limited thereto. The high-voltage semiconductor device 100 may include a trench gate structure 110, an emitter 135, a body 106, a collector 154, a barrier layer 107, a buffer layer 152, an emitter electrode 140, and a collector electrode 150. The high-voltage semiconductor device 100 operates more than 6V.

As illustrated, the trench gate structure 110 may include a plurality of trench gates 111 to 118. A trench 109 may be formed in the substrate 102, a gate insulating film 120 may be conformally formed along a side wall and a bottom surface of the trench 109, and the trench gates 111 to 118 may be formed on the gate insulating film 120 in the trench 109. The gate insulating film 120 may include at least one of a silicon oxide film, a silicon nitride film, a silicon oxynitride film, and a high-k material. The high-k material may include, for example, at least one of $HfO_2$, $ZrO_2$, and $Ta_2O_5$, but is not limit thereto. Unlike those as illustrated, the trench 109 may have various cross-sectional shapes. The cross-section of the trench 109 may be further inclined as it goes inside the substrate 102, or may be in a rectangular shape.

Further, the trench gate structure 110 may be in a ladder shape. Specifically, the trench gate structure 110 that is arranged on the left side in FIG. 2 may include first and second trench gates 111 and 112 extending long in one direction DR1 and third and fourth trench gates 113 and 114 connecting the first and second trenches 111 and 112 with each other. The third and fourth trench gates 113 and 114 may extend in a different direction DR2 from the one direction DR1.

Similarly, the trench gate structure 110 that is arranged on the right side in FIG. 2 may include fifth and sixth trench gates 115 and 116 extending long in the one direction DR1 and seventh and eighth trench gates 117 and 118 connecting the fifth and sixth trenches 115 and 116 with each other. The seventh and eighth trench gates 117 and 118 may extend in the different direction DR2 from the one direction DR1.

On the other hand, as illustrated in FIG. 4, a first region I, second regions IIa and IIb, and a third region III may be defined by the trench gate structure 110.

The first region I may be defined by the first to fourth trench gates 111 to 114. The second regions IIa and IIb may be in surface contact with the first region I. The third region III may be in point contact with the first region I.

As illustrated, the first region I may be in a polygon shape. For example, the first region I may be in a rectangular shape. Accordingly, the polygon shape may include surfaces and points. As used herein, the term "being in surface contact with" means that a surface (or edge) of the first region I and surfaces (or edges) of the second regions IIa and IIb are arranged to face each other. Further, as used herein, the term "being in point contact with" means that a point (corner) of the first region I and a point (corner) of the third region III are arranged to face each other.

On the other hand, due to a reason in processing, the corner portion (point portion) of the first region I may be rounded. However, even in this case, it may be expected that the corner portions exist, and it may be considered that the first region I and the third region III are in point contact with each other.

More specifically, the first region I may be a region that is surrounded by the first to fourth trench gates 111 to 114. The second regions IIa and IIb may be arranged on the upper, lower, right, and left sides of the first region I. The second region IIa may be located on upper and lower sides of the first region I. The second region IIb may be located on right and left sides of the first region I. The third region III may be placed on upper right, lower right, upper left, and lower left sides of the first region I. As illustrated in FIG. 4, the second region IIb and the third region III may be physically connected, but are not limited thereto.

In the semiconductor device 1 according to example embodiments of inventive concepts, first conduction type (for example, p-type) floating wells 105a and 105b are formed in the second regions IIa and IIb and the third region III. The role and the effect of the floating wells 105a and 105b will be described later.

Referring again to FIG. 3, the high-voltage semiconductor device 100 may be formed in the first region I. Specifically, the first conduction type (for example, p-type) body 106 and the second conduction type (for example, n-type) emitters 135 formed in the body 106 may be formed in the first region I. Selectively, a first conduction type (p-type) doping region 136 may be formed between the emitters 135. The body 106 may be formed thinner than the first trench gate 111.

As illustrated in FIG. 2, the emitters 135 may be formed in two portions of the first region I. For example, the emitters 135 may be formed close to opposite sides of the first region I (for example, two opposite sides in the DR2 direction) of the first region I. The first region I in FIG. 4 corresponds to reference number 105 in FIG. 2.

Referring to FIG. 3, a second conduction type barrier layer 107 may be formed below the body 106. To be described later, the barrier layer 107 serves as a potential barrier with respect to holes flowing into the substrate 102 (e.g., drift region). The holes are further accumulated in the drift region, and the conductivity modulation is strengthened. The barrier layer 107 may be of the second conduction type in the same manner as the drift region. The barrier layer 107 has higher doping concentration than that of the drift region. Further, the barrier layer 107 may have lower doping concentration than that of the floating wells 105a and 105b. The barrier layer 107 may be doped with, for example, P and As with the doping concentration of $10^{13}$ to $10^{17}$/cm$^3$.

The substrate 102 may be doped with P or As, for example, with the doping concentration of $10^{12}$ to $10^{15}/cm^3$. The body 106 may be doped with B, for example, with the doping concentration of $10^{15}$ to $10^{18}/cm^3$.

An interlayer insulating film 130 may be formed on one surface of the substrate 103, and a contact 145 may be formed to penetrate the interlayer insulating film 130 and to be in contact with the emitters 135 and the emitter electrode 140. The emitter electrode 140 may be formed in a plate shape on the interlayer insulating film 130 (see FIG. 1), but is not limited thereto. The interlayer insulating film 130 may be, for example, a silicon oxide film, but is not limited thereto. The contact 145 and the emitter electrode 140 may include a metal, such as at least one of aluminum, copper, tungsten, and titanium, but is not limited thereto. The contact 145 and the emitter electrode 140 may be formed of the same material or may be formed of different materials.

The collector 154 may formed on the other surface of the substrate 102. The collector 154 may be of the first conduction type. The collector electrode 150 may include a metal, such as at least one of aluminum, copper, tungsten, titanium, nickel, nickel vanadium, silver, and gold, but is not limited thereto. The collector electrode 150 and the emitter electrode 140 may be formed of the same material or may be formed of different materials.

The buffer layer 152 may be formed on the other surface of the substrate 102 to be in contact with the collector 154, but is not limited thereto. The buffer layer 152 may serve to improve the withstanding voltage characteristic through prevention of a punchthrough phenomenon. The buffer layer 152 may be of the second conduction type in the same manner as the substrate 102 (drift region). The buffer layer 152 may have higher doping concentration than the drift region and may have lower doping concentration than the emitter 135. The buffer layer 152 may be doped with P or As with the doping concentration of $10^{13}$ to $10^{19}/cm^3$.

Hereinafter, the role and the effect of the first conduction type floating wells 105a and 105b will be described.

The conduction modulation means a phenomenon that if the number of minor carriers (e.g., holes) is increased in a region where the concentration of major carriers (e.g., electrons) is low, the major carriers are increased in proportion to the increased number of minor carriers, and thus the electric resistance may be reduced to that extent. In the semiconductor device 1 according to example embodiments of inventive concepts, the substrate 102 (drift region) may be doped with a second conduction type (n-type) dopant with low doping concentration. Accordingly, if holes are increased in the drift region, the number of electrons in the drift region may be increased in proportion to the increased number of holes. Thus, current flows from the collector 154 in the direction of the emitter 135.

As the area of the floating wells 105a and 105b is increased, a larger number of holes can be accumulated in the substrate 102 (e.g., drift region). However, it is unable to unconditionally increase the area of the floating wells 105a and 105b. This is because if the area of the floating wells 105a and 105b is increased, the area, in which the emitter 135, the body 106, and the like, are formed, may be relatively reduced. If the area, in which the emitter 135, the body 106, and the like, are formed, is reduced, the current driving capability of the high-voltage semiconductor device 100 may be decreased.

However, in the semiconductor device 1 according to example embodiments of inventive concepts, the area of the floating wells 105a and 105b may be maximally increased (or increased to a desired area) while the minimum area width (or desired low area or low width), in which the emitter 135, the body 106, and the like, are formed, may be maintained.

For example, as illustrated in FIG. 4, the first to third regions I, IIa, IIb, and III may be defined by the trench gate structure 110. The first region I may be defined by the first to fourth trench gates 111 to 114. The second regions IIa and IIb may be in surface contact with the first region I. The third region III may be in point contact with the first region I. In the semiconductor device 1 according to example embodiments of inventive concepts, the high-voltage semiconductor device 100 may be formed in the first region I. The first conduction type (for example, p-type) floating wells 105a and 105b may be formed in the second regions IIa and IIb and the third region 111.

By doing so, the floating well 105b may be arranged even in a region between two high-voltage semiconductor devices 100 which are adjacent to each other in the right/left direction (e.g., DR2 direction) and in a region between two high-voltage semiconductor devices 100 which are adjacent in the diagonal direction. In addition, the floating well 105a may be arranged even in a region between two high-voltage semiconductor devices 100 which are adjacent to each other in the upper/lower direction (e.g., DR1 direction). The two adjacent high-voltage semiconductor devices 100 may be spaced apart from each other. In other words, the two adjacent high-voltage semiconductor devices 100 may be arranged so they are not in surface contact or point contact with each other.

The length L3 of the first region I in the DR2 direction may match the desired (or minimum) width in which the emitter 135, the body 106, and the like, must be formed. Further, in order to sufficiently secure the area of the floating wells 105a and 105b, the second regions IIa and IIb may be adjusted as follows. The length L2 of the second region IIa in the DR1 direction may be longer than the length L1 of the first region I in the DR1 direction. The length L4 of the second region IIb in the DR2 direction may be longer than the length L3 of the first region I in the DR2 direction.

By doing so, in the semiconductor device 1 according to example embodiments of inventive concepts, the area of the floating wells 105a and 105b can be increased to a desired level (and/or maximized). Accordingly, hole accumulation may be increased in the substrate 102 (e.g., drift region), and the conduction modulation can be increased to a desired level (and/or maximized).

Figure 5:
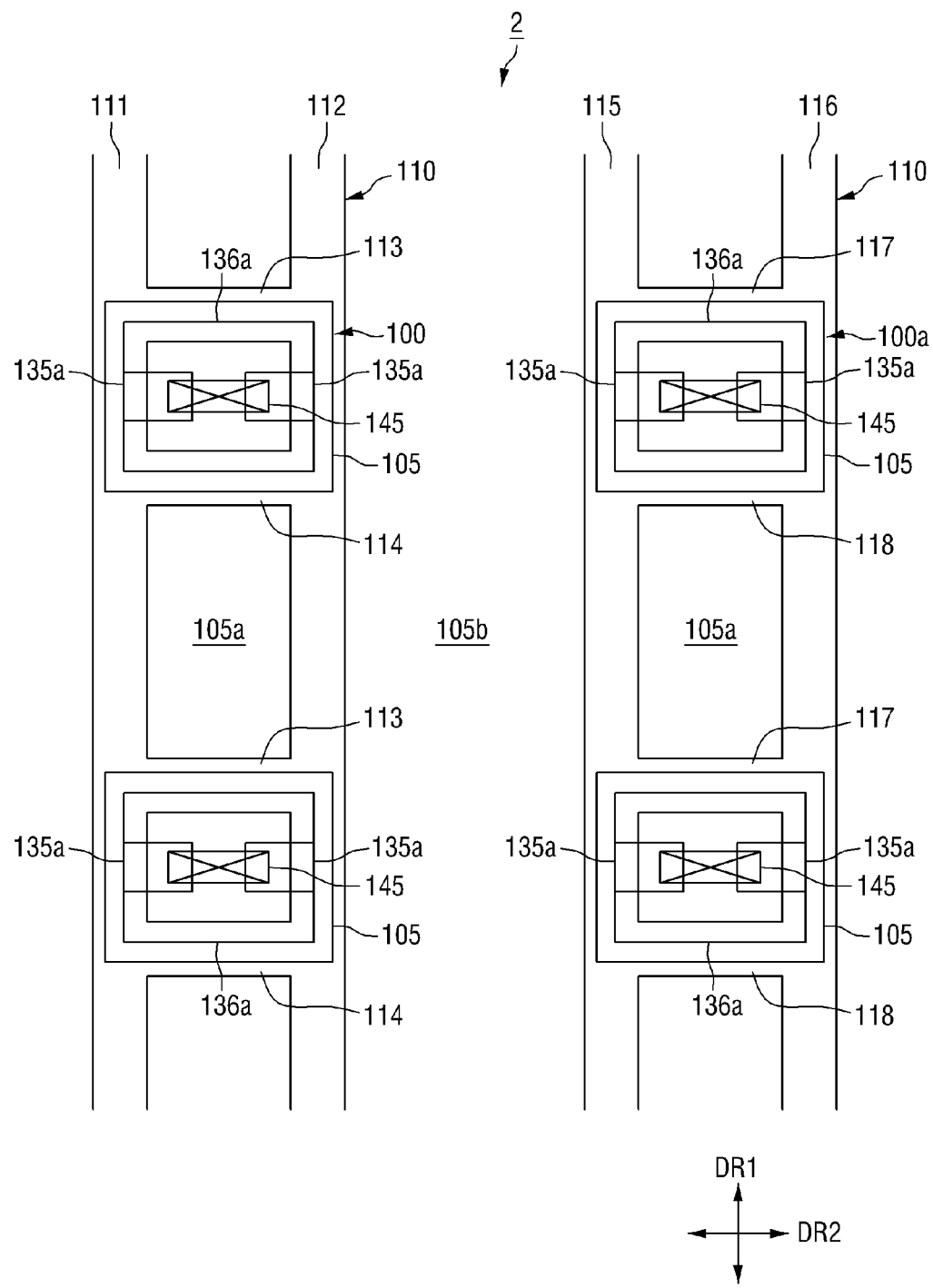
FIG. 5 is a partial layout diagram of a semiconductor device according to example embodiments of inventive concepts.

FIG. 5 is a partial layout diagram of a semiconductor device according to example embodiments of inventive concepts. Hereinafter, explanation will be made around a point which is different from that as described above using FIGS. 1 to 4.

Referring to FIG. 5, an emitter 135a of a semiconductor device 2 according to example embodiments of inventive concepts is smaller than the emitter (see 135 in FIG. 2) of the semiconductor device 1 according to example embodiments of inventive concepts. The emitter 135a may be formed only on a part of the two opposite surfaces of the first region I, whereas the emitter (135 in FIG. 2) is formed on the two whole opposite surfaces of the first region (see I in FIG. 4). As illustrated in FIG. 5, a first conduction type (p-type) doping region 136a may be formed between the emitters 135a.

On the other hand, on short circuit conditions, the short current Isc of quite high level may flow through the high-voltage semiconductor device 100. The high-voltage semiconductor device 100 can endure the short conditions for a desired (and/or alternatively predetermined) time. In the semiconductor device 2 according to example embodiments of inventive concepts, the size of the emitter 135a is smaller, and thus the short current Isc becomes quite low. Accordingly, the semiconductor device 2 according to example embodiments of inventive concepts may be configured to endure the short conditions for a quite long time.

Figure 6:
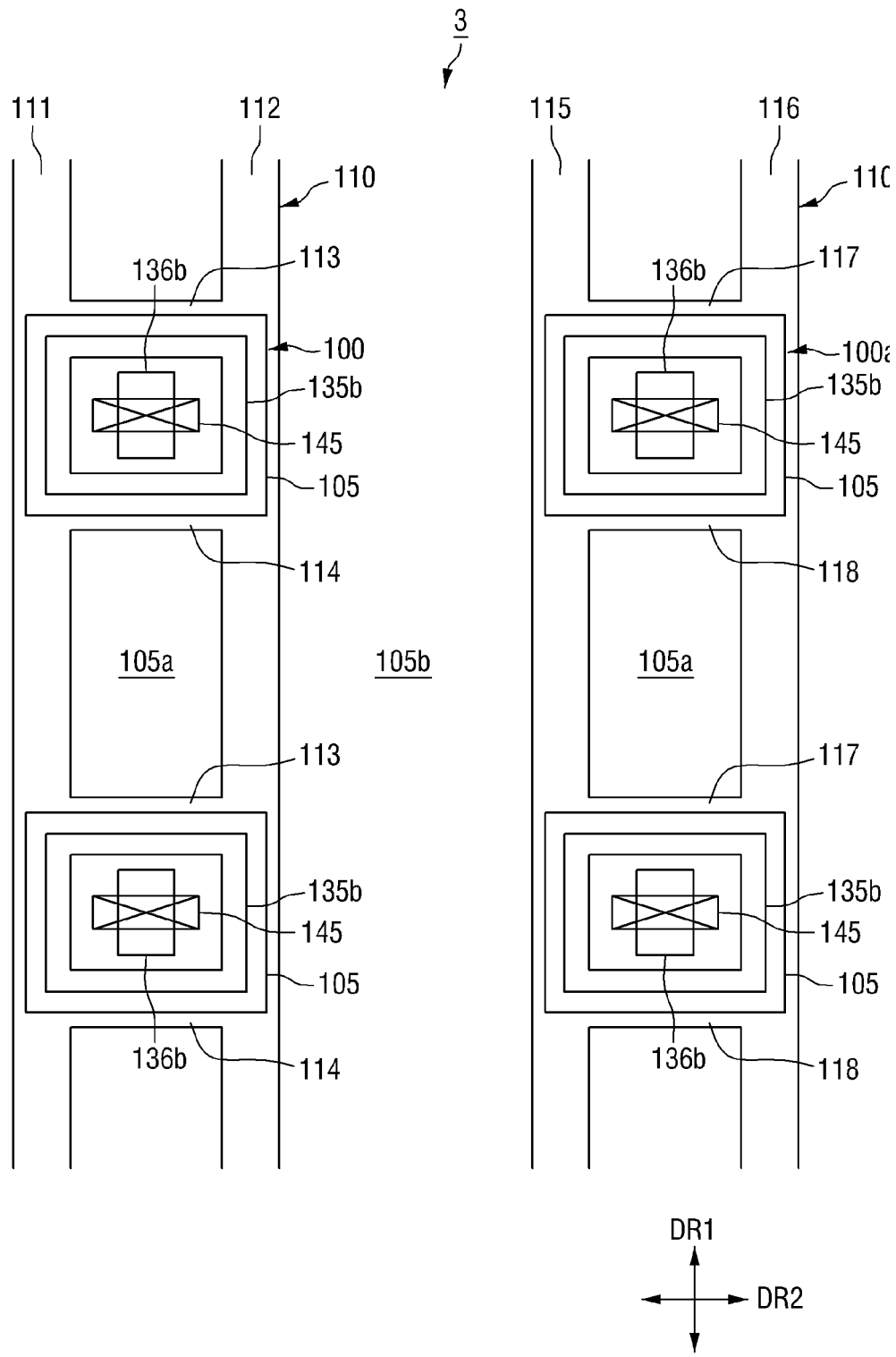
FIG. 6 is a partial layout diagram of a semiconductor device according to example embodiments of inventive concepts.

FIG. 6 is a partial layout diagram of a semiconductor device according to example embodiments of inventive concepts. Hereinafter, explanation will be made around a point which is different from that as described above using FIGS. 1 to 4.

Referring to FIG. 6, an emitter 135b of a semiconductor device 3 according to example embodiments of inventive concepts is larger than the emitter (see 135 in FIG. 2) of the semiconductor device 1 according to example embodiments of inventive concepts. The emitter 135b may be formed on four surfaces of the first region I, whereas the emitter (135 in FIG. 2) is formed on the two opposite surfaces of the first region (see I in FIG. 4). As illustrated in FIG. 6, a first conduction type (p-type) doping region 136b may be surrounded by the emitter 135b.

If the area of the emitter 135b is wide as described above, the level of current between the collector and the emitter may be increased in a normal operation state, and on the short conditions, the short current Isc may also be increased. If there is no problem in enduring the short current Isc for a predetermined time, the area of the emitter 135b may be maximally widened to maximize the current between the collector and the emitter in the normal operation state.

Figure 7:
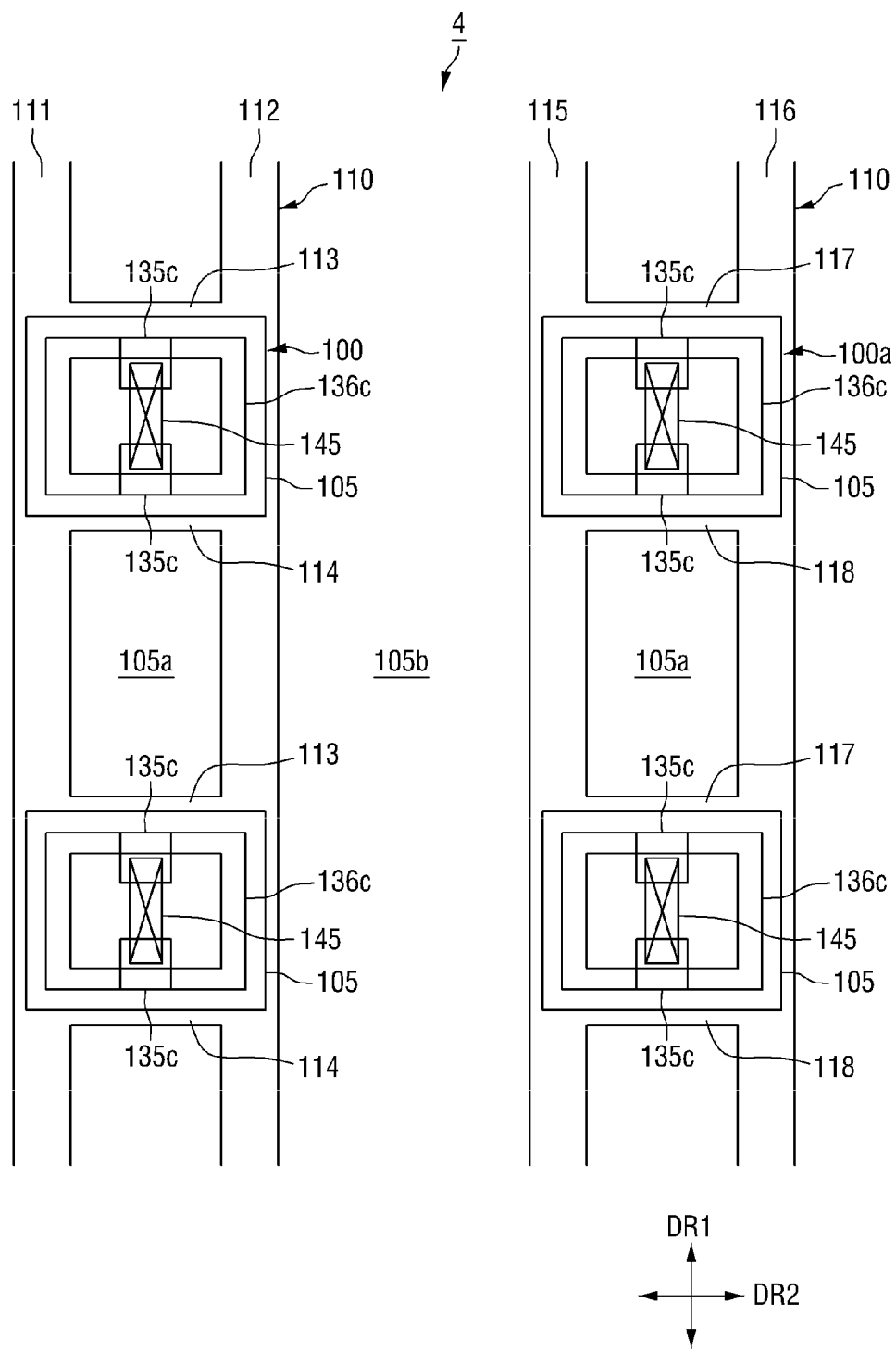
FIG. 7 is a partial layout diagram of a semiconductor device according to example embodiments of inventive concepts.

FIG. 7 is a partial layout diagram of a semiconductor device according to example embodiments of inventive concepts. Hereinafter, explanation will be made around a point which is different from that as described above using FIGS. 1 to 4.

Referring to FIG. 7, in the semiconductor device 4 according to example embodiments of inventive concepts, two emitters 135c may be arranged in parallel to the extension direction (e.g., DR1 direction) of the first and second trench gates 111 and 112. By contrast, the emitter (see 135 in FIG. 2) of the semiconductor device 1 according to example embodiments of inventive concepts may be arranged in parallel to the extension direction (e.g., DR2 direction) of the third and fourth trench gates 113 and 114. As illustrated in FIG. 7, a first conduction type (p-type) doping region 136c may be between the emitters 135c.

If the position of the emitter 135c is changed, the size or the shape of the first region (see I in FIG. 4) may also be somewhat changed. In consideration of the overall layout of the semiconductor device 4, the position of the emitter 135c may be changed.

FIGS. 8A to 8D are partial layout diagrams of semiconductor devices according to example embodiments of inventive concepts.

Figure 8A:
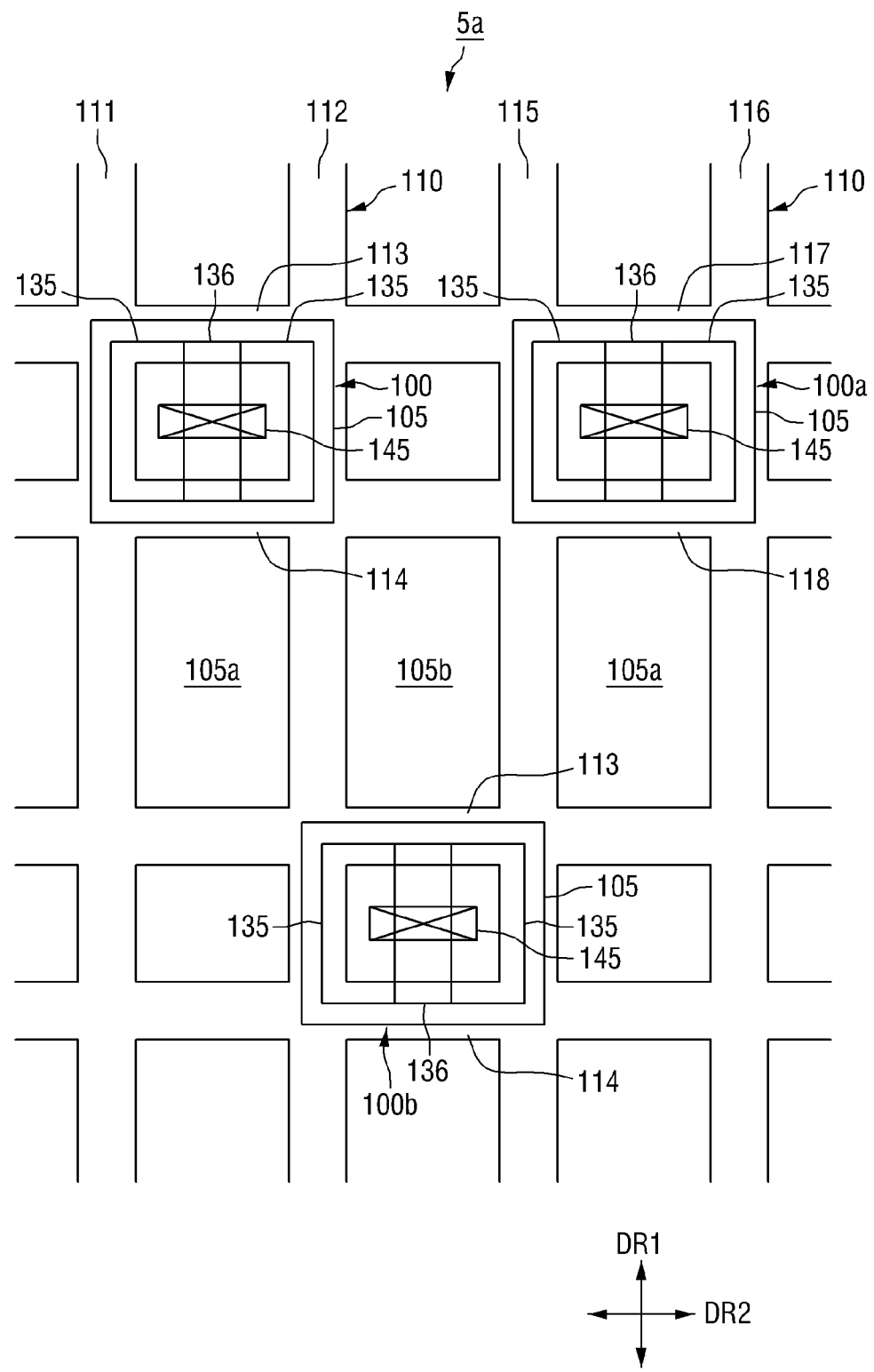
FIGS. 8A to 8D are partial layout diagrams of semiconductor devices according to example embodiments of inventive concepts.

Referring to FIG. 8A, in the semiconductor device 5a according to example embodiments of inventive concepts, the trench gate structure 110 may be in a mesh shape. The first, second, fifth, and sixth trench gates 111, 112, 115, and 116 extend long in the DR1 direction, and the third and fourth trench gates 113 and 114 extend long in the DR2 direction. The third and fourth trench gates 113 and 114 may be formed to cross the first, second, fifth, and sixth trench gates 111, 112, 115, and 116.

Even if the trench gate structure 110 is in a mesh shape, the high-voltage semiconductor devices 100, 100a, and 100b may be arranged to be spaced apart from each other. As described above, the two adjacent high-voltage semiconductor devices 100, 100a and 100b are not directly in surface contact or point contact with each other. For example, the high-voltage semiconductor device 100 may be arranged between the first trench gate 111 and the second trench gate 112, and the high-voltage semiconductor device 100b may be arranged between the second trench gate 112 and the fifth trench gate 115. The high-voltage semiconductor device 100a may be arranged between the fifth trench gate 115 and the sixth trench gate 116.

Figure 8B:
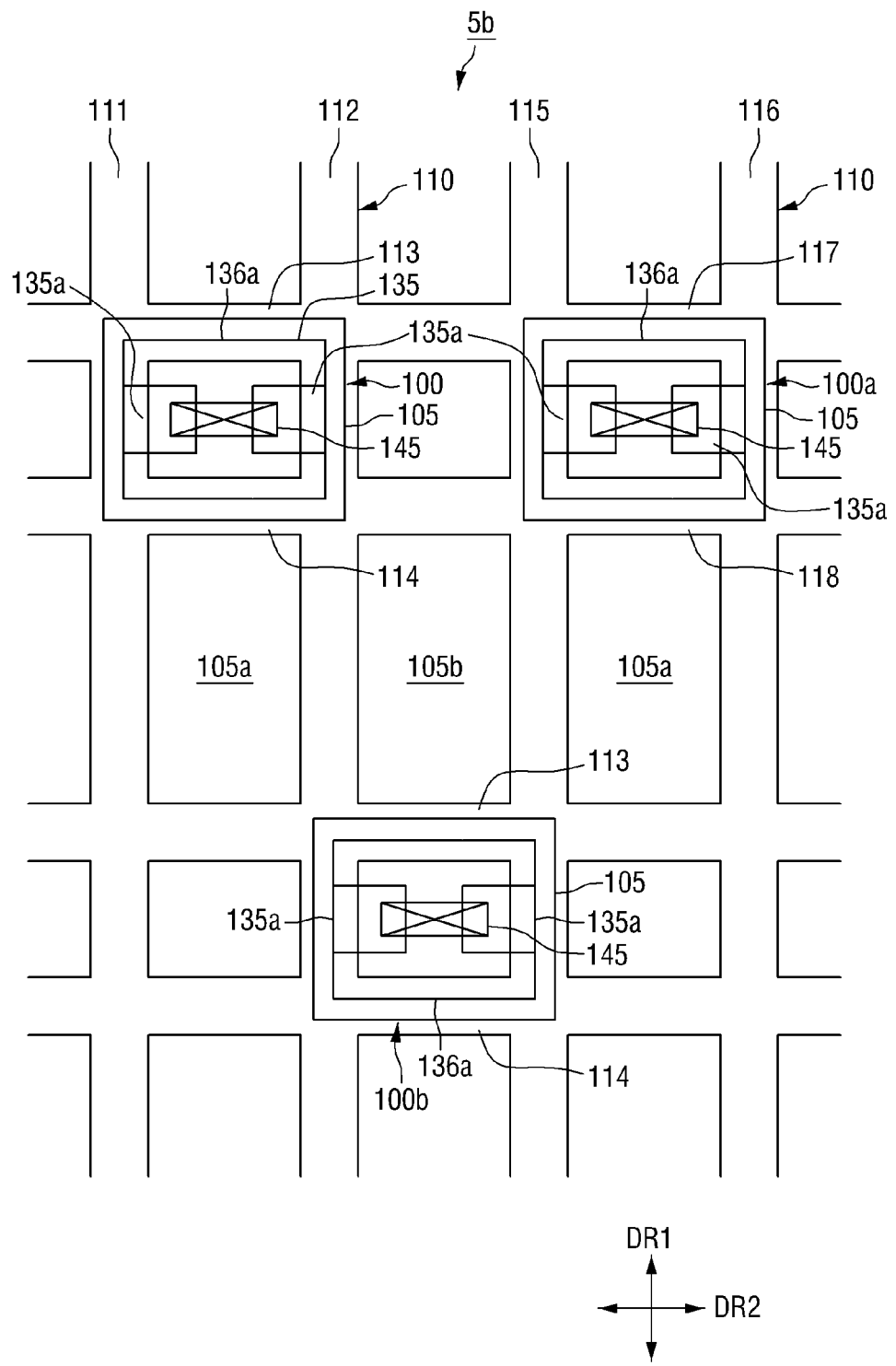

Referring to FIG. 8B, an emitter 135a of a semiconductor device 5b according to example embodiments of inventive concepts may be smaller than the emitter (see 135 in FIG. 8A) of the semiconductor device 5a. As illustrated in FIG. 8B, a first conduction type (p-type doping region 136a may be formed between the emitters 135a.

Figure 8C:
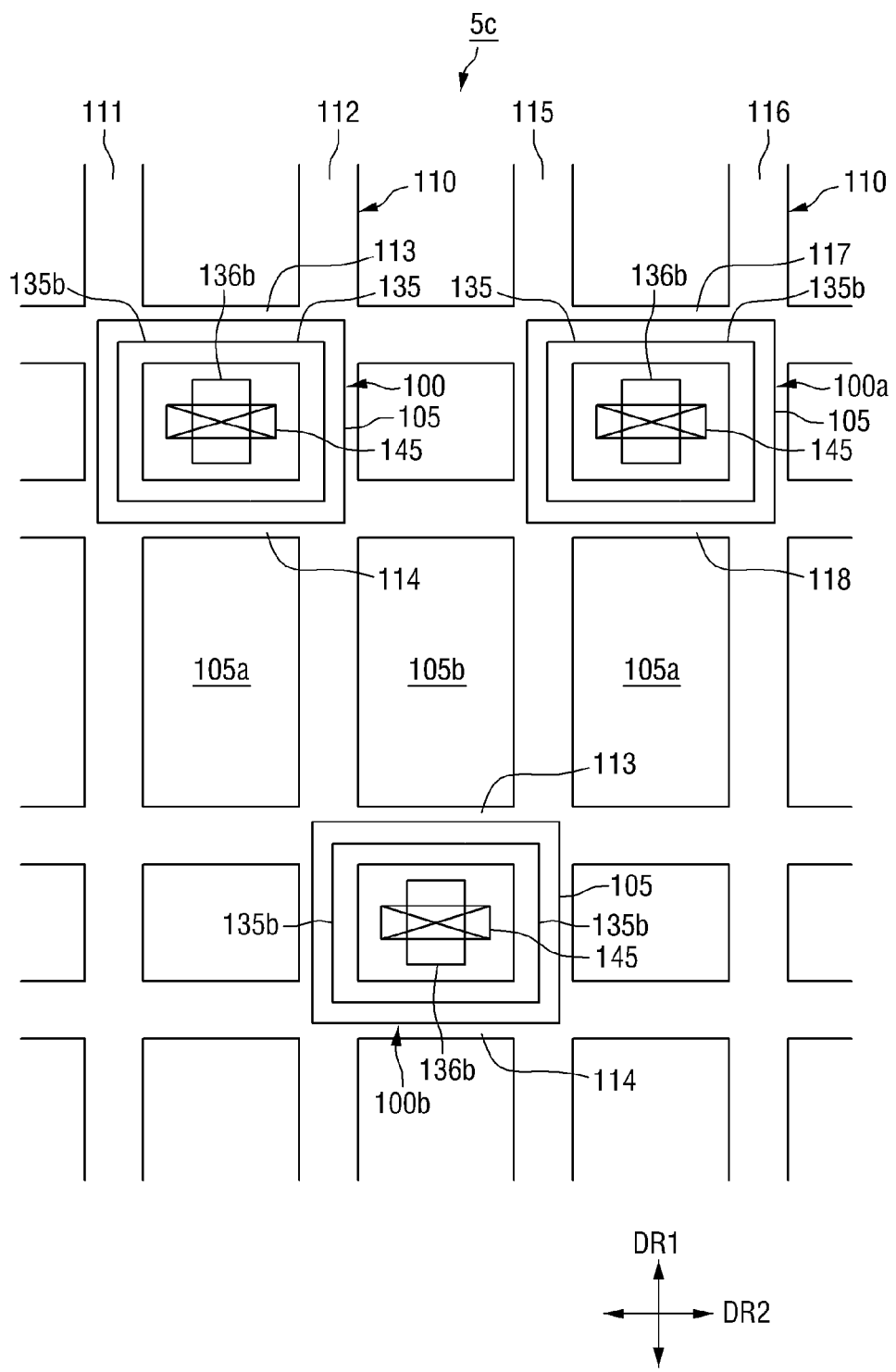

Referring to FIG. 8C, an emitter 135b of a semiconductor device 5c according to example embodiments of inventive concepts may be larger than the emitter (see 135 in FIG. 8A) of the semiconductor device 5a. The emitter may be formed on four surfaces of the first region I. As illustrated in FIG. 8C, a first conduction type (p-type doping region 136a may be surrounded by the emitter 135b.

Figure 8D:
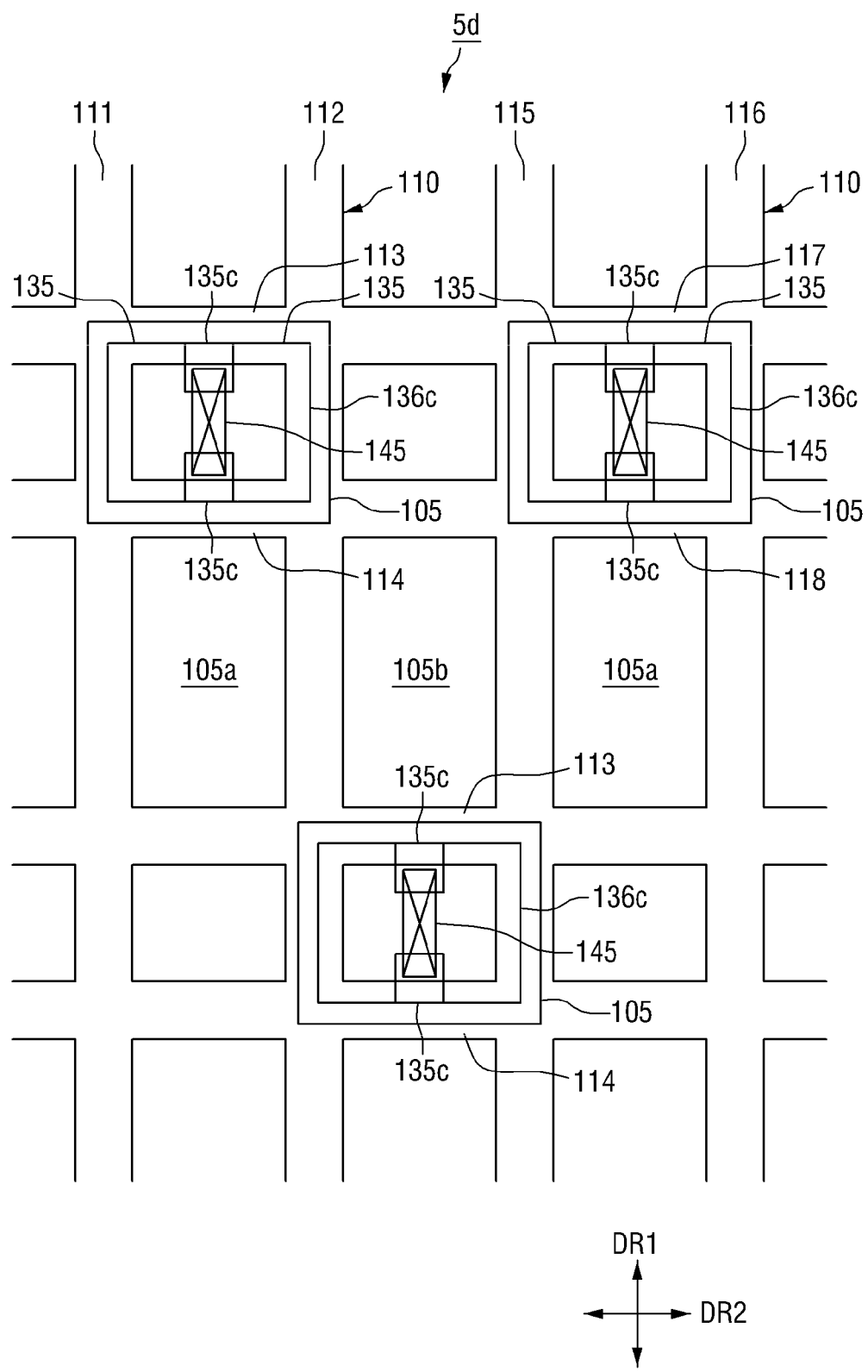

Referring to FIG. 8D, an emitter 135c of a semiconductor device 5d according to example embodiments of inventive concepts may be smaller than the emitter (see 135 in FIG. 8A) of the semiconductor device 5a. The emitter 135c may be spaced apart in the extension direction (e.g., DR1 direction). As illustrated in FIG. 8D, a first conduction type (p-type doping region 136c may be between the emitters 135c.

Figure 9:
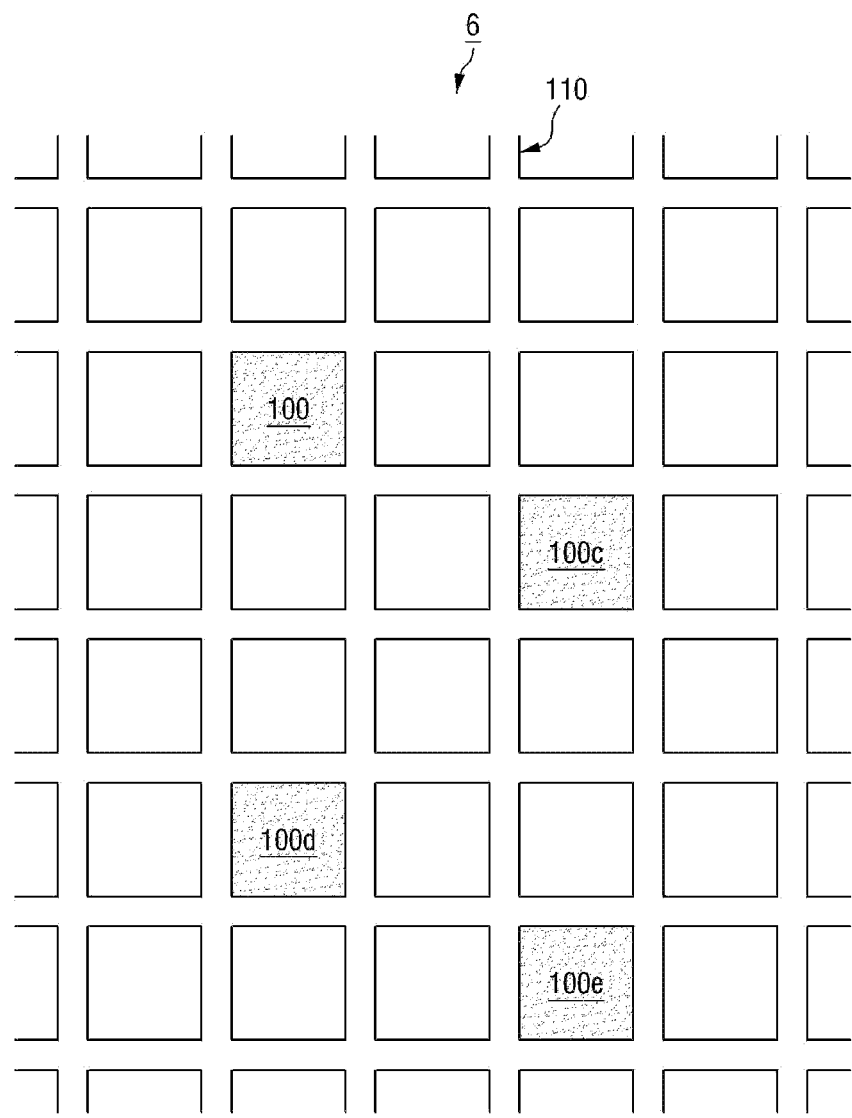
FIG. 9 is a partial layout diagram of a semiconductor device according to example embodiments of inventive concepts.
Figure 10:
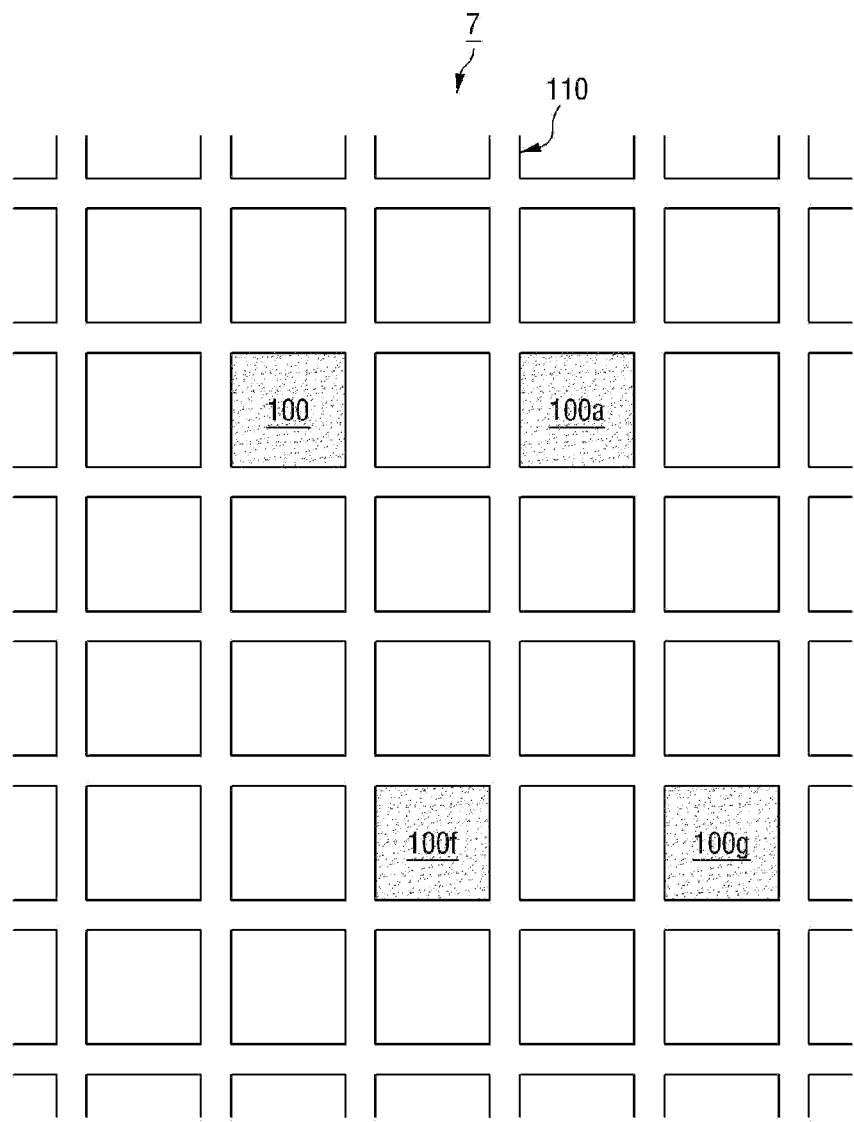
FIG. 10 is a partial layout diagram of a semiconductor device according to example embodiments of inventive concepts.

FIG. 9 is a partial layout diagram of a semiconductor device according to example embodiments of inventive concepts. FIG. 10 is a partial layout diagram of a semiconductor device according to example embodiments of inventive concepts.

FIGS. 9 and 10 are views explaining a method for arranging high-voltage semiconductor devices 100, 100c, 100d, and 100e in a mesh type trench gate structure. If the two adjacent high-voltage semiconductor devices 100, 100c, 100d and 100e are not directly in surface contact or point contact with each other, the high-voltage semiconductor devices 100, 100c, 100d and 100e may be arranged in any method.

For example, in the semiconductor device 6 according to example embodiments of inventive concepts, the high-voltage semiconductor device 100c is spaced apart from the high-voltage semiconductor device 100 for one block in the DR1 direction and for two blocks in the DR2 direction. The high-voltage semiconductor device 100d is spaced apart from the high-voltage semiconductor device 100 for two blocks in the DR1 direction. The high-voltage semiconductor device 100e is spaced apart from the high-voltage semiconductor device 100d for one block in the DR1 direction and for two blocks in the DR2 direction.

In the semiconductor device 7 according to example embodiments of inventive concepts, the high-voltage semiconductor device 100f is spaced apart from the high-voltage semiconductor device 100 for three blocks in the DR1 direction and for one block in the DR2 direction. The high-voltage semiconductor device 100g is spaced apart from the high-voltage semiconductor device 100a for three blocks in the DR1 direction and for one block in the DR2 direction.

Figure 11:
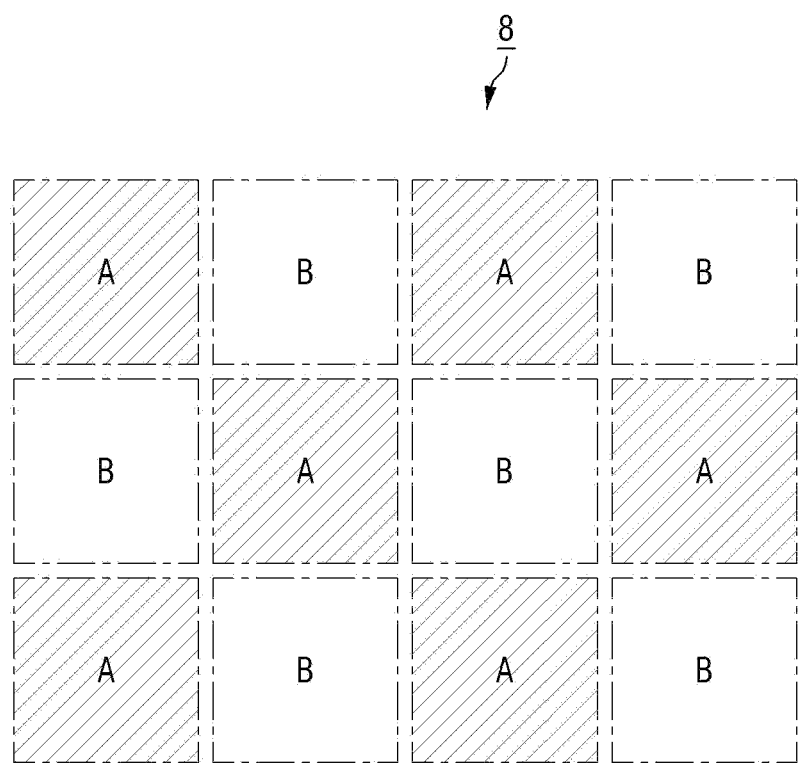
FIG. 11 is a conceptual diagram explaining a semiconductor device according to an example embodiments of inventive concepts.

FIG. 11 is a conceptual diagram explaining a semiconductor device according to example embodiments of inventive concepts.

Referring to FIG. 11, a semiconductor device 8 according to example embodiments of inventive concepts includes a first repetition unit A and a second repetition unit B, which are different from each other.

The first repetition unit A may be any one of the semiconductor devices according to example embodiments of inventive concepts, and the second repetition unit B may be another one of the semiconductor devices according to example embodiments of inventive concepts. For example, the first repetition unit A may have a layout illustrated in FIG. 2, and the second repetition unit B may have a layout illustrated in FIG. 5. Further, the first repetition unit A may have a layout illustrated in FIG. 9, and the second repetition unit B may have layout illustrated in FIG. 10.

The first repetition unit A may include a plurality of high-voltage semiconductor devices and a plurality of first conduction type floating wells, and the second repetition unit B includes a plurality of high-voltage semiconductor devices and a plurality of first conduction type floating wells. The arrangements of the plurality of high-voltage semiconductor devices and the plurality of floating wells in the first repetition unit A are different from the arrangements of the plurality of high-voltage semiconductor devices and the plurality of floating wells in the second repetition unit B.

As a result, a width ratio of the high-voltage semiconductor device to the floating well in the first repetition unit A may be different from a width ratio of the high-voltage semiconductor device to the floating well in the second repetition unit B. Since the width ratios of the high-voltage semiconductor elements to the floating wells are different from each other, the conduction modulation in the first repetition unit A may be different from the conduction modulation in the second repetition unit B.

FIG. 11 illustrates a case where two repetition units are provided. However, the number of repetition units is not limited thereto, but three or more repetition units may be provided.

Figure 12:
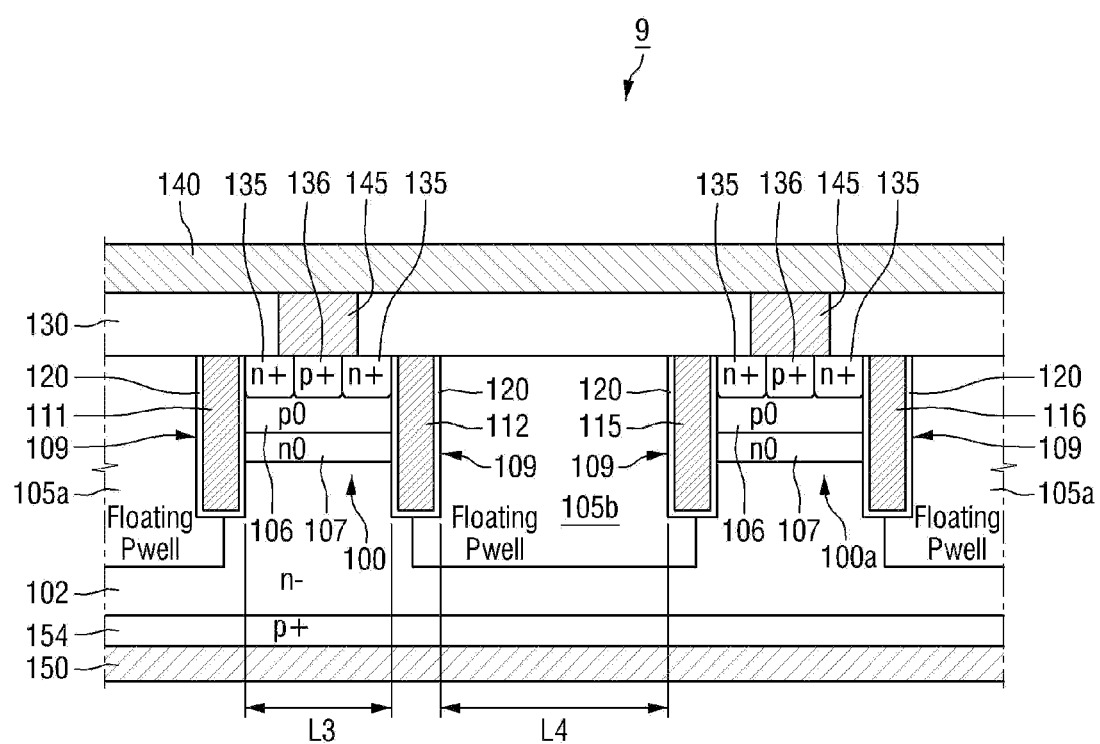
FIG. 12 is a conceptual diagram explaining a semiconductor device according to example embodiments of inventive concepts.
Figure 13:
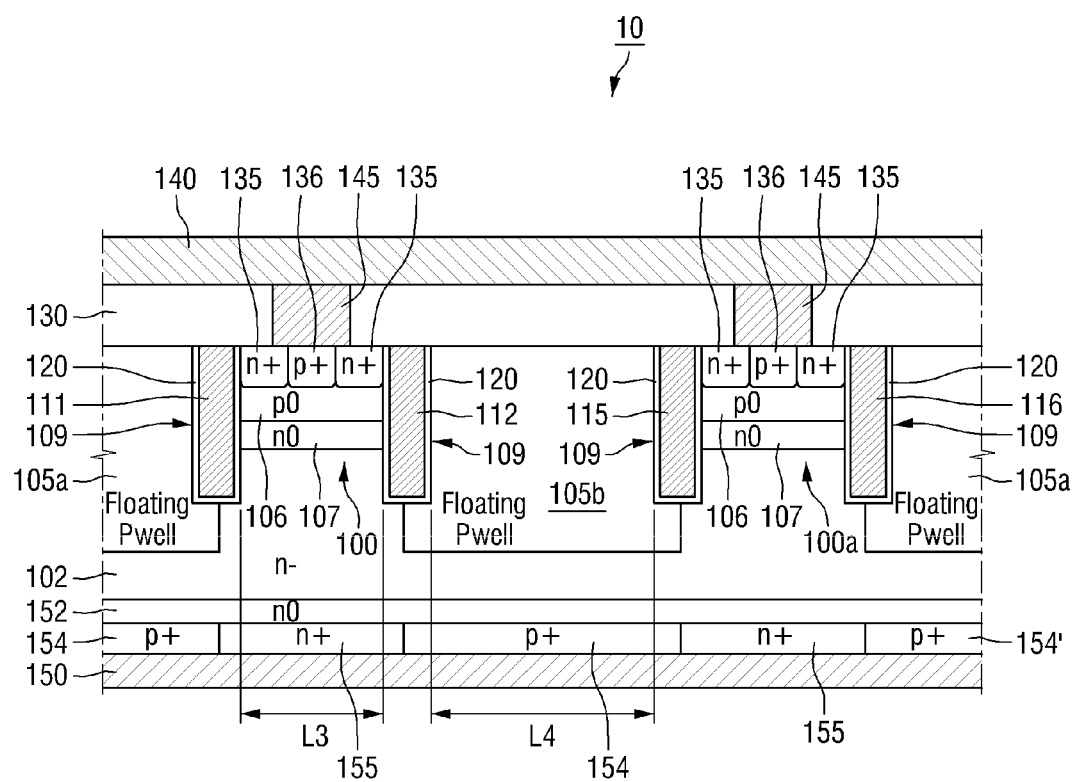
FIG. 13 is a conceptual diagram explaining a semiconductor device according to example embodiments of inventive concepts.

FIG. 12 is a conceptual diagram explaining a semiconductor device according to example embodiments of inventive concepts. FIG. 13 is a conceptual diagram explaining a semiconductor device according to example embodiments of inventive concepts. Hereinafter, explanation will be made around a point which is different from that as described above using FIGS. 1 to 4.

Referring to FIG. 12, a semiconductor device 9 according to example embodiments of inventive concepts may be without a buffer layer 152. If the withstanding voltage characteristic is sufficiently high even without the buffer layer 152, the buffer layer 152 may be omitted.

Referring to FIG. 13, in a semiconductor device 10 according to example embodiments of inventive concepts, the collector 154' may be in a patterned shape instead of being formed on the whole of the other surface of the substrate 102. Between the patterned collectors 154', a second conduction type doping region 155 may be arranged. The concentration of the doping region 155 may be higher than the concentration of the buffer layer 152. Since the substrate 102, the buffer layer 152, and the doping region 155 may be of the second conduction type, and the body 106 is of the first conduction type, it may be considered that a diode is formed inside the semiconductor device 10.

Figure 14:
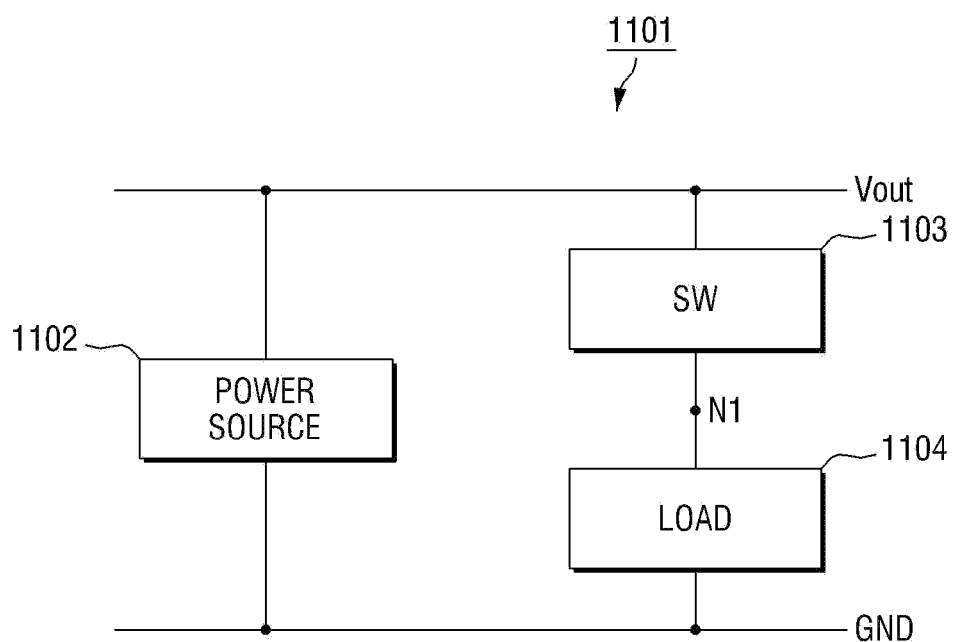
FIG. 14 is a block diagram explaining a semiconductor system including the semiconductor devices according to example embodiments of inventive concepts.

FIG. 14 is an block diagram explaining a semiconductor system including the semiconductor devices according to some embodiments of the present inventive concept.

Referring to FIG. 14, a semiconductor system 1101 including the semiconductor devices according to example embodiments of inventive concepts may include a power source 1102, a switch 1103, and a load 1104. The switch 1103 may transfer power from the power source 1102 to the load 1104. For example, the power source 1102 may provide a voltage equal to or higher than 600V. On short conditions (for example, ground voltage GND is applied to the node N1), the voltage equal to or higher than 600V may be instantaneously applied to the switch 1103. The switch 1103 must endure for a desired (and/or alternatively predetermined) time (for example, equal to or longer than 5 μs).

As such a switch 1103, at least one of the semiconductor devices according to example embodiments of inventive concepts as described above using FIGS. 1 to 13 may be used.

Although an example in FIG. 14 is described where semiconductor devices according to example embodiments of inventive concepts as described above using FIGS. 1 to 13 are used in the power supply device, example embodiments of inventive concepts are not limited thereto.

Figure 15:
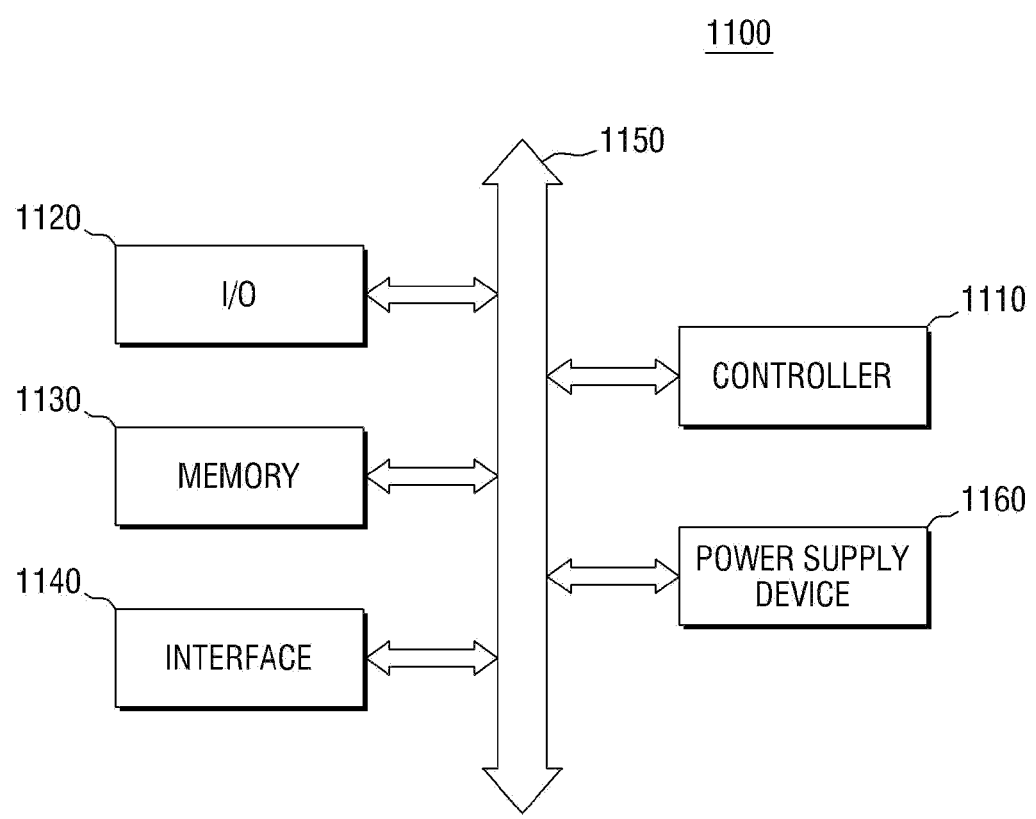
FIG. 15 is a block diagram of an electronic system including a semiconductor system according to example embodiments of inventive concepts.

FIG. 15 is a block diagram of an electronic system including a semiconductor system according to example embodiments of inventive concepts.

Referring to FIG. 15, an electronic system 1100 according to example embodiments of inventive concepts may include a controller 1110, an input/output (I/O) device 1120, a memory 1130, an interface 1140, a power supply device 1160, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110. A fin field-effect transistor according to embodiments of the present inventive concept may be provided inside the memory 1130 or may be provided as a part of the controller 1110 and the I/O device 1120. The power supply device 1160 may convert and provide a power input from an outside to the respective constituent elements 1110, 1120, 1130, and 1140. One or more power supply devices 1160 may be provided in the electronic system 1100.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 16:
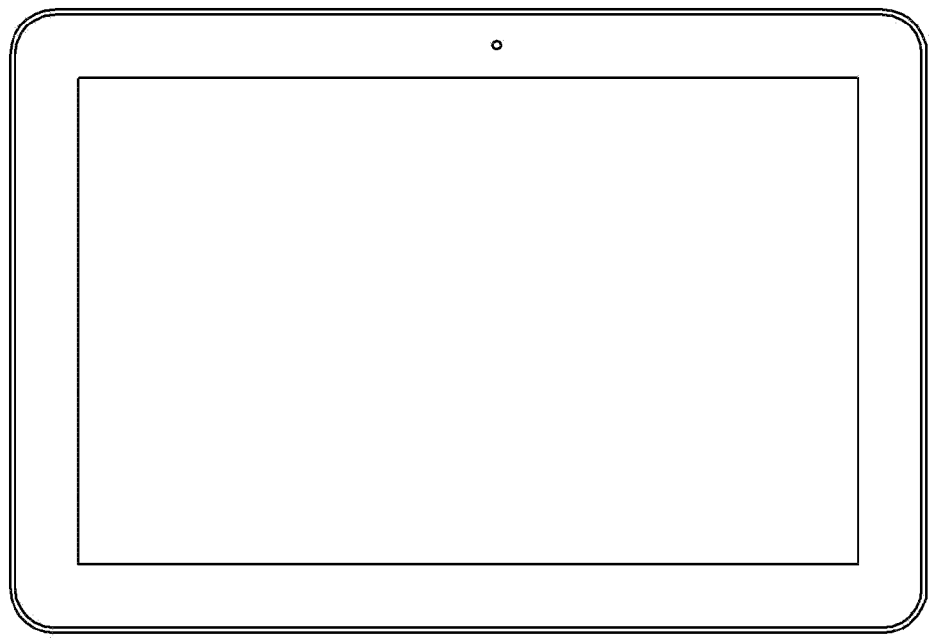
FIGS. 16 and 17 are views of a semiconductor system to which a semiconductor device according to example embodiments of inventive concepts can be applied.
Figure 17:
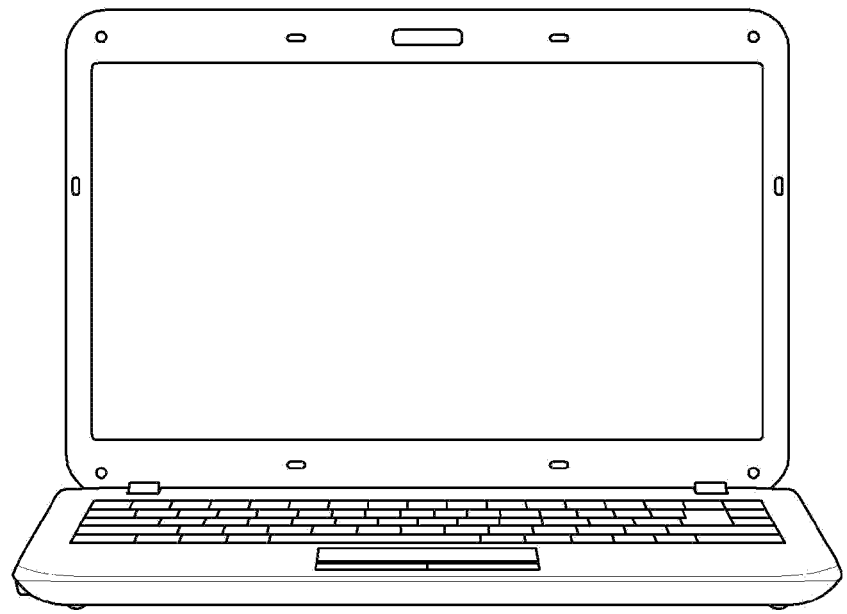

FIGS. 16 and 17 are views of a semiconductor system to which the semiconductor device according to example embodiments of inventive concepts can be applied. FIG. 16 illustrates a tablet PC, and FIG. 17 illustrates a notebook PC. It is apparent to those of skilled in the art that a semiconductor device according to example embodiments of inventive concepts can be applied even to other integrated circuit devices.

Figure 18A:
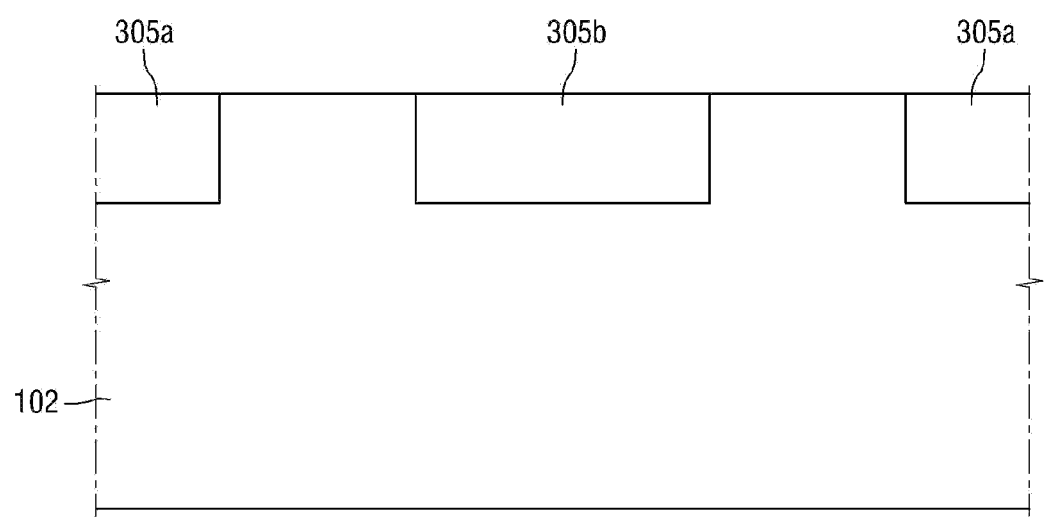
FIGS. 18A to 23 are views of intermediate steps explaining a method for fabricating a semiconductor device according to example embodiments of inventive concepts, where

Hereinafter, referring to FIGS. 18A to 23, a method for fabricating a semiconductor device according to example embodiments of inventive concepts will be described. FIGS. 18A to 23 are views of intermediate steps explaining a method for fabricating a semiconductor device according to example embodiments of inventive concepts. FIG. 18A is a cross-sectional view cut along line XVIII-XVIII' in a layout diagram of FIG. 18B. FIG. 20A is a cross-sectional diagram cut along line XX-XX' in a layout diagram of FIG. 20B.

Figure 18B:
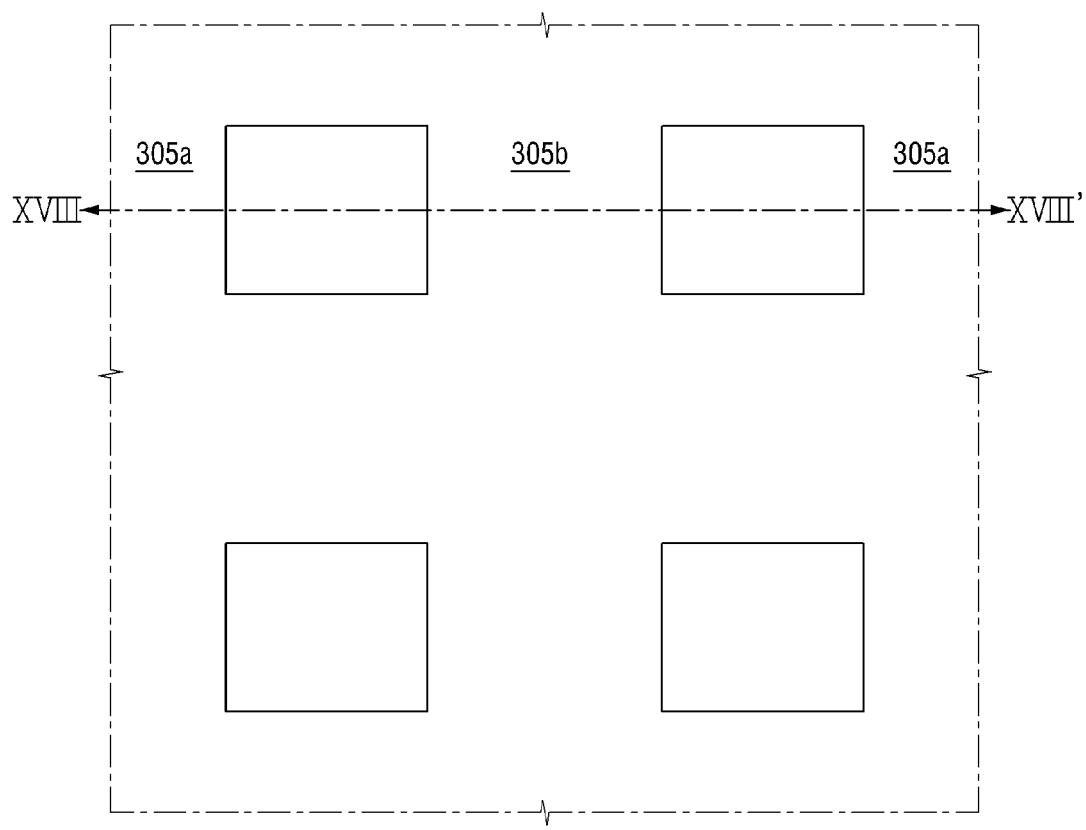

Referring to FIGS. 18A and 18B, a mask pattern may be formed on the substrate 102, and the first conduction type doping regions 305a and 305b may be formed in the substrate 102. The first conduction type doping regions 305a and 305b may form the floating wells (see 105a and 105b in FIG. 3). For example, the first conduction type doping regions 305a and 305b may be formed by implanting the first conduction type dopant. The first conduction type dopant may be, for example, boron (B), but is not limited thereto.

Then, the mask pattern is removed.

Figure 19:
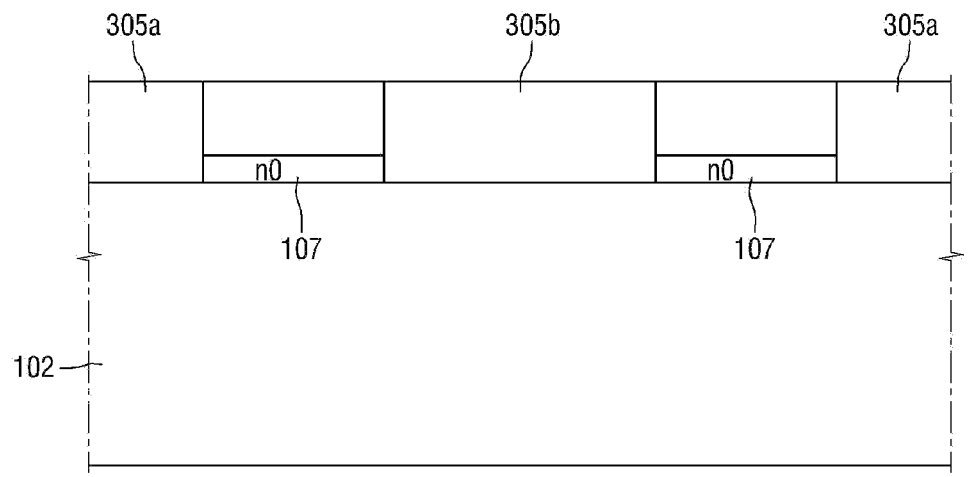
Figure 20A:
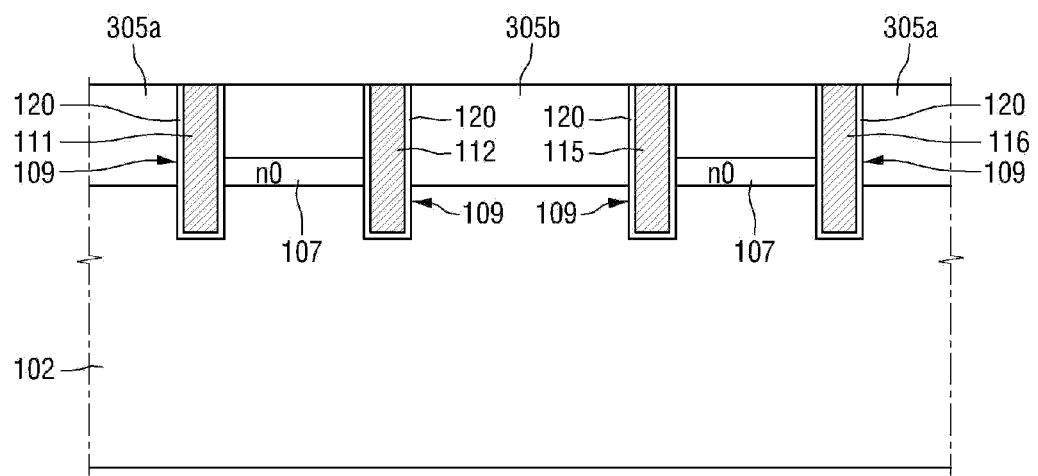
FIG. 20A is a cross-sectional diagram cut long line XX-XX' of FIG. 20B.

Referring to FIG. 19, a second conduction type barrier layer 107 is formed in the substrate 102.

Specifically, the barrier layer 107 can be formed by implanting the second conduction type dopant into the front surface of the substrate 102 without a mask pattern. Here, the concentration of the barrier layer 107 is quite lower than the concentration of the first conduction type doping regions 305a and 305b. Accordingly, as illustrated, the barrier layer 107 may not be formed in the doping regions 305a and 305b. The second conduction type dopant may be phosphorous (P), but is not limited thereto.

Figure 20B:
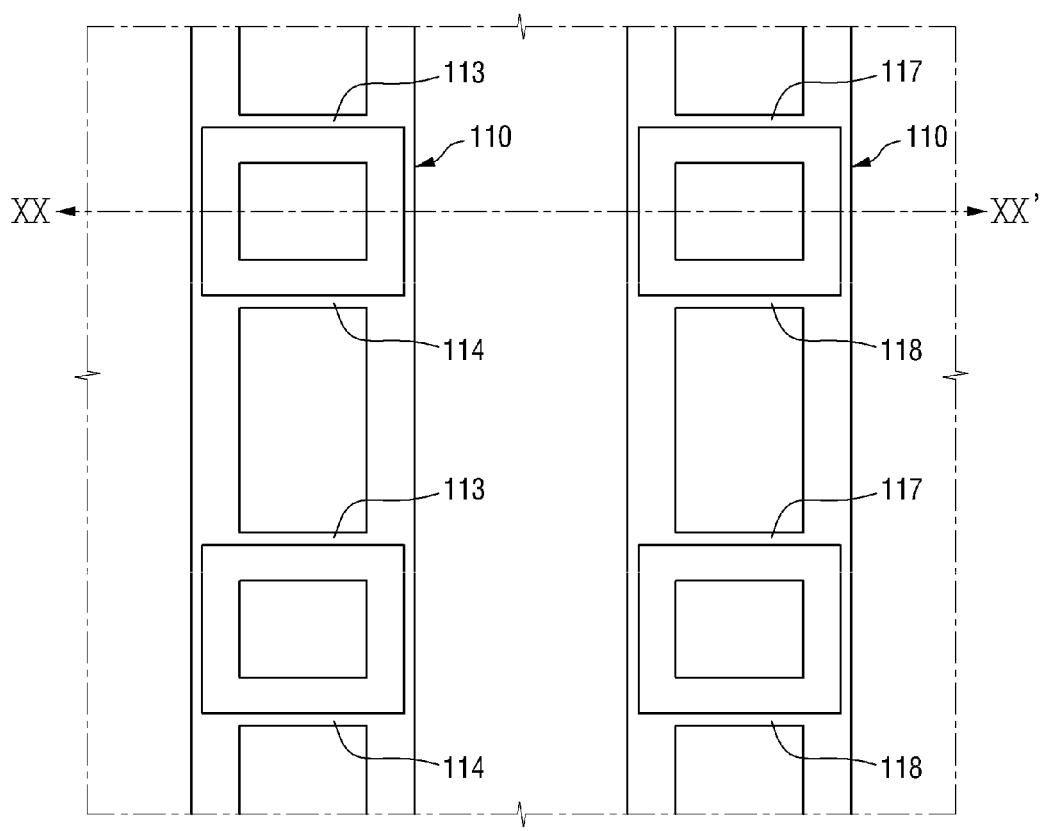

Referring to FIGS. 20A and 20B, a trench gate structure 110 may be formed in the substrate 102.

A trench 109 may be formed in the substrate 102. As illustrated, the depth of the trench 109 may be deeper than the depth of the barrier layer 107 and the doping regions 305a and 305b.

Then, a gate insulating film 120 may be conformally formed along a side wall and a bottom surface of the trench 109. The gate insulating film 120 may include an insulating material such as at least one of a silicon oxide film, a silicon nitride film, a silicon oxynitride film, and a high-k material.

Then, the trench gate structure 110 may be completed through filling the trench 109 on the gate insulating film 120 with trench gates 111 to 118. For example, the trench 109 is filled with the conduction material so that the conduction material is sufficiently formed on the substrate 102, and CMP is performed so that an upper surface of the substrate 102 is exposed to complete the first and second trench gates 111 and 112.

As described above using FIG. 4, the trench gate structure 110 may be in a ladder shape. Specifically, the trench gate structure 110 may include the first and second trench gates 111 and 112 extending long in one (DR1) direction, and third and fourth trench gates 113 and 114 connecting the first and second trench gates 111 and 112 to each other. The third and fourth trench gates 113 and 114 may extend in another (DR2) direction that is different from the one (DR1) direction.

Figure 21:
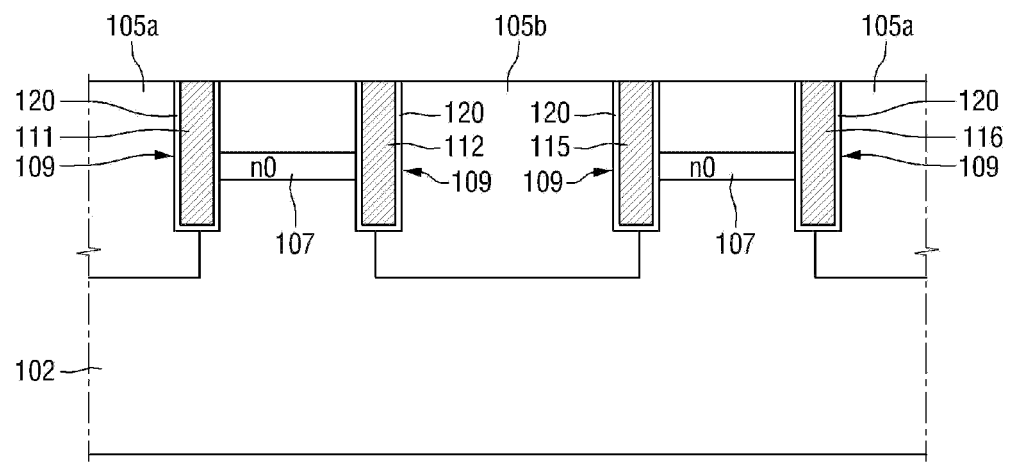

Referring to FIG. 21, the first conduction type floating wells 105a and 105b are completed by diffusing the first conduction type doping regions 305a and 305b through a drive-in process. The drive-in process may be, for example, thermal tube annealing, RTA (Rapid Thermal Annealing), or laser annealing.

In the drive-in process, both the first conduction type doping regions 305a and 305b and the second conduction type barrier layer 107 can be diffused. However, phosphorous (P) is relatively less diffused than boron (B). While the first conduction type floating wells 105a and 105b are completed, the barrier layer 107 is not greatly diffused.

Figure 22:
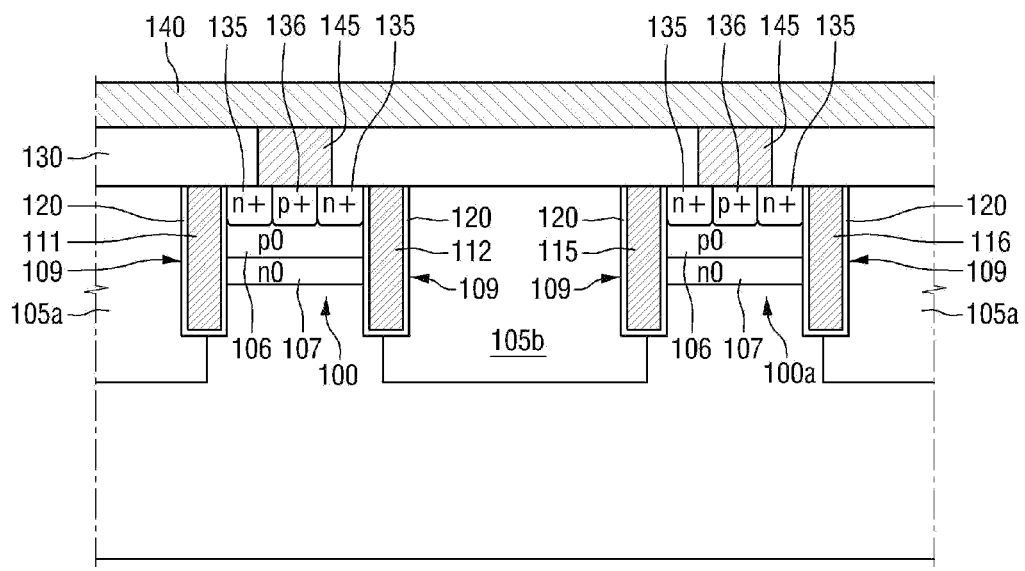

Referring to FIG. 22, a first conduction type body 106 may be formed.

Then, second conduction type emitters 135 may be formed in the body 106. Further, in the body 106, a first conduction type doping region 136 may be formed between the emitters 135.

Then, an interlayer insulating film 130 may be formed on one surface of the substrate 102.

Then, a contact 145 may be formed so that the contact 145 penetrates the interlayer insulating film 130 and comes in contact with the emitters 135 and the first conduction type doping region 136.

Then, on the interlayer insulating film 130, an emitter electrode 140 may be formed to be in contact with the contact 145. The emitter electrode 140 may be formed in a plate shape. The contact 145 and the emitter electrode 140 may include at least one of aluminum, copper, tungsten, and titanium, but are not limited thereto.

Figure 23:
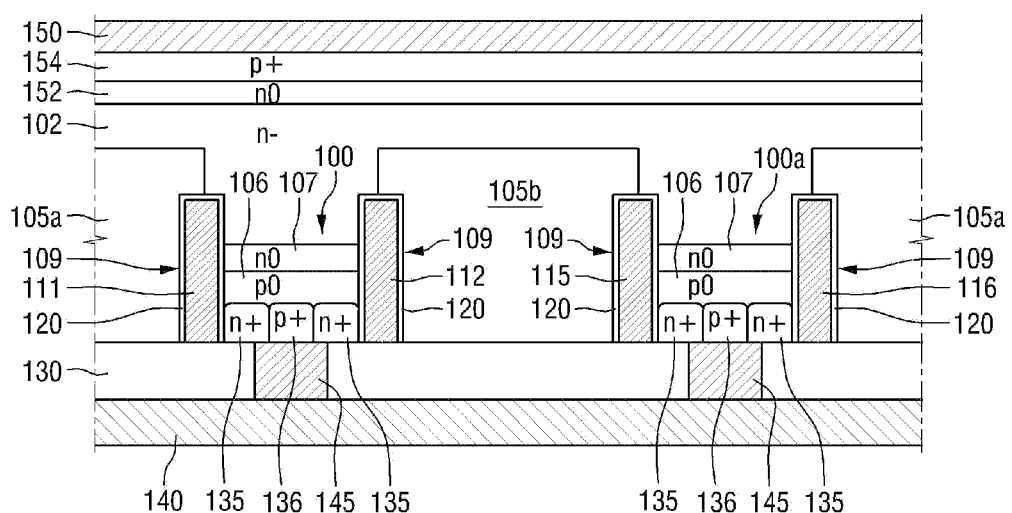

Referring to FIG. 23, the thickness of the substrate 102 may be reduced through a thinning process.

Then, a buffer layer 152 is formed on the other surface of the substrate 102.

Then, on the other surface of the substrate 102, the first collector 154 may be formed to be in contact with the buffer layer 152. The collector 154 may be of the first conduction type.

Then, on the other surface of the substrate 102, a collector electrode 150 may be formed to be in contact with the collector 154. The collector electrode 150 may include at least one of aluminum, copper, tungsten, titanium, nickel, nickel vanadium, silver, and gold, but is not limited thereto.

While some example embodiments have been particularly shown and described, it will be understood by one of ordinary skill in the art that variations in form and detail may be made therein without departing from the spirit and scope of the claims.

What is claimed is:

1. A semiconductor device comprising:
    a substrate;
    first and second trench gates extending long in one direction in the substrate;
    third and fourth trench gates in the substrate,
    a fifth trench gate extending in the substrate parallel to the first and second trench gates;
    a sixth trench gate extending in the substrate parallel to the third and fourth trench gates, the third, fourth and sixth trench gates connecting the first, second, and fifth trench gates to each other;
    a first region defined in the substrate by the first to fourth trench gates,
        the first region being surrounded by the first to fourth trench gates,
        the first region including a first high-voltage semiconductor device,
        the first high-voltage semiconductor device including a body and an emitter in the body,
            the body being a first conduction type, and
            the emitter being a second conduction type that is opposite the first conduction type; and
    a second region and a third region defined in the substrate,
        the second region being defined by the first, second, fourth, and sixth trench gates,
        the third region being defined by the second, fourth, fifth, and sixth trench gates,
        the second region being in surface contact with the first region,
        the third region being in point contact with the first region,
        the second region and the third region including floating wells that are the first conduction type.

2. The semiconductor device of claim 1, wherein
    a vertical thickness of the body is less than a vertical thickness of the first trench gate, and
    a vertical thickness of the floating wells is more than the vertical thickness of the body.

3. The semiconductor device of claim 2, wherein the vertical thickness of the floating wells is thicker than the vertical thickness of the first trench gate.

4. The semiconductor device of claim 1, wherein a length of the second region in the one direction is longer than a length of the first region in the one direction.

5. The semiconductor device of claim 1, further comprising:
   a seventh trench gate in the substrate; and
   a second high-voltage semiconductor device in the substrate between the fifth and seventh trench gates, wherein
   the fifth and seventh trench gates extend long in the one direction, and
   the first, second, fifth, and seventh trench gates are arranged in order.

6. The semiconductor device of claim 5, wherein a length between the first trench gate and the second trench gate is shorter than a length between the second trench gate and the fifth trench gate.

7. The semiconductor device of claim 1, further comprising:
   a third high-voltage semiconductor device in the substrate between the first and second trench gates, wherein
   a portion of the second region is between the first high-voltage semiconductor device and the third high-voltage semiconductor device.

8. The semiconductor device of claim 1, wherein the third and fourth trench gates cross the first and second trench gates.

9. The semiconductor device of claim 1, wherein the emitter is in two portions of the first region.

10. The semiconductor device of claim 9, wherein
    the emitter is in only a part of the two portions of the first region, and
    the two portions of the first region are at opposite sides of the first region.

11. A semiconductor device comprising:
    a substrate;
    a first trench gate structure in the substrate,
        the first trench gate structure having a ladder shape; and
    first and second regions defined in the substrate,
        the first and second regions surrounded by portions of the first trench gate structure,
        the first region including a high-voltage semiconductor device,
        the high-voltage semiconductor device including a body having a first conduction type and vertical thickness that is less than a vertical thickness of the first trench gate structure,
        the high-voltage semiconductor device including an emitter in the body,
        the emitter having a second conduction type that is opposite the first conduction type,
        the high-voltage semiconductor device including a barrier layer below the body, the barrier layer being the second conduction type, a lower surface of the barrier layer is vertically above a lower surface of the first trench gate structure, and
        the second region including a first floating well having the first conduction type and a vertical thickness that is thicker than the vertical thickness of the first trench gate structure, a lower surface of the first floating well is below the lower surface of the first trench gate structure.

12. The semiconductor device of claim 11, wherein
    the first region is one among a plurality of first regions defined in the substrate,
    the second region is one among a plurality of second regions defined in the substrate,
    the plurality of first regions and the plurality of second regions are alternately arranged, and
    the high-voltage semiconductor devices in the plurality of first regions and the first floating wells of the plurality of second regions are alternately repeated with each other.

13. The semiconductor device of claim 12, wherein
    a length direction of the first trench gate structure extends in one direction, and
    a length of the second region in the one direction is longer than a length of the first region in the one direction.

14. The semiconductor device of claim 11, further comprising:
    a second trench gate structure in the substrate, wherein
    the second trench gate structure has the ladder shape, and
    the second trench gate structure is adjacent to the first trench gate structure.

15. The semiconductor device of claim 14, further comprising:
    a third region defined in the substrate between the first trench gate structure and the second trench gate structure, wherein
    the third region includes a second floating well having the first conduction type.

16. The semiconductor device of claim 11, wherein the emitter is in two portions of the first region.

17. The semiconductor device of claim 16, wherein
    the emitter is in only a part of the two portions of the first region, and
    the two portions of the first region are at opposite sides of the first region.

18. A semiconductor device comprising:
    a substrate;
    a first repetition unit in the substrate,
        the first repetition unit including first and second trench gates extending long in one direction,
        the first repetition unit including third and fourth trench gates connecting the first and second trench gates with each other,
        the first repetition unit including a first region that is defined in the substrate by the first to fourth trench gates and surrounded by the first to fourth trench gates,
        the first region including a plurality of first high-voltage semiconductor devices,
        the first repetition unit including a second region defined in the substrate,
        the second region being in surface contact with the first region, and
        the second region including a plurality of first floating wells having a first conduction type; and
    a second repetition unit in the substrate,
        the second repetition unit including a plurality of second high-voltage semiconductor devices and a plurality of second floating wells,
        the second floating wells having the first conduction type, and
        a layout and structure of the first repetition unit being different than a layout and structure of the second repetition unit.

19. The semiconductor device of claim 18, wherein a width ratio of one of the plurality of first high-voltage semiconductor devices to one of the plurality of first floating wells in the first repetition unit is different than a width ratio of one of the plurality of second high-voltage semiconductor devices to one of the plurality of the second floating wells in the second repetition unit.

20. The semiconductor device of claim 18, wherein
the plurality of first high-voltage semiconductor devices include a body and an emitter in the body,
the body is the first conduction type,
a vertical thickness of the body is thinner than a vertical thickness of the first trench gate, and
a vertical thickness of the plurality of first floating wells is thicker than the vertical thickness of the first trench gate.

21. The semiconductor device of claim 18, wherein a length of the second region in the one direction is longer than a length of the first region in the one direction.

22. The semiconductor device of claim 18, wherein
the first repetition unit further comprises a third region defined in the substrate,
the third region is in point contact with the first region, and
the third region includes some of the plurality of first floating wells.

23. The semiconductor device of claim 18, wherein
the first region includes a barrier layer below the body,
the barrier layer is the second conduction type,
the substrate includes a drift region below the barrier layer,
the drift region is the second conduction type,
a portion of the drift region extends vertically between sidewalls of the first and second trench gates to contact a lower surface of the barrier layer,
the lower surface of the barrier layer is vertically above a lower surface of the first and second trench gates, and
a bottom surface of the first floating wells is below a bottom surface of the first trench gate.

24. The semiconductor device of claim 18, wherein
the first to fourth trench gates of the first repetition unit are part of a trench gate structure having a ladder shape in the first repetition unit,
the second repetition unit includes a trench gate structure having a mesh shape,
the mesh shape is different than the ladder shape,
two of the first high-voltage semiconductor devices are adjacent to each other and in surface contact with each other with one of the first floating wells in between,
the plurality of second high-voltage semiconductor devices are arranged so adjacent second high-voltage semiconductor devices among the second high-voltage semiconductor devices are not directly in surface contact with each other or directly in point contact with each other.

25. A semiconductor device comprising:
a substrate,
the substrate including a first region and a second region over a drift region,
the first region including a transistor that is defined by a body of a first conduction type in the substrate, an emitter of a second conduction type in the body, and a doping region of the first conduction type in a portion of the body that is exposed by the emitter,
the first region including a barrier layer between the drift region and the body, and
the second region including a floating well of the first conduction type,
the floating well having a vertical thickness that is greater than a vertical thickness of the body in the first region;
a first trench gate structure in the substrate between second region and a perimeter of the first region,
the first trench gate structure having a ladder shape,
the first trench gate structure exposing the first region and the second region of the substrate,
the first trench gate structure having a vertical thickness that is greater than the vertical thickness of the body in the first region, and
a lower surface of the first trench gate structure being between a lower surface of the barrier layer and a lower surface of the floating well.

26. The semiconductor device of claim 25, further comprising:
a collector contacting a lower surface of the substrate; and
an emitter electrode electrically connected to the doping region of the transistor in the first region of the substrate.

27. The semiconductor device of claim 25, wherein
the first region of the substrate is one among a plurality of first regions in the substrate,
the second region of the substrate is one among a plurality of second regions in the substrate,
some of the plurality of the second regions alternate along a first direction with the plurality of first regions between alternating runs of the first trench gate structure having the ladder shape,
others of the plurality of second regions are arranged as pairs separated by the trench gate structure and one of the plurality of first regions along a second direction, and
the second direction crosses the first direction.

28. The semiconductor device of claim 27, wherein a length in the first direction of one of the plurality of the first regions is less than a length in the first direction of one of the some of the plurality of second regions.

29. The semiconductor device of claim 27, wherein a width in the second direction of one of the plurality of the first regions is less than a width in the second direction of one of the others of the plurality of second regions.

30. A semiconductor device comprising:
a substrate;
first and second trench gates extending long in one direction in the substrate;
third and fourth trench gates in the substrate,
the third and fourth trench gates connecting the first and second trench gates with each other;
a first region defined in the substrate by the first to fourth trench gates,
the first region being surrounded by the first to fourth trench gates,
the first region including a first high-voltage semiconductor device,
the first high-voltage semiconductor device including a body and an emitter in the body,
the body being a first conduction type,
the first region including a barrier layer below the body,
the barrier layer being a second conduction type, and
the emitter being the second conduction type that is opposite the first conduction type; and
a second region and a third region defined in the substrate,
the second region being in surface contact with the first region,
the third region being in point contact with the first region,
the second region and the third region including floating wells that are the first conduction type, wherein
the substrate includes a drift region below the barrier layer,
the drift region is the second conduction type,
a portion of the drift region extends vertically between sidewalls of the first and second trench gates to contact a lower surface of the barrier layer, the lower surface of the barrier layer is vertically above a lower surface of the first and second trench gates.

31. The semiconductor device of claim 30, wherein a bottom surface of the floating wells is below a bottom surface of the first trench gate.

* * * * *